United States Patent
Obu et al.

(10) Patent No.: US 10,355,114 B2
(45) Date of Patent: *Jul. 16, 2019

(54) HETEROJUNCTION BIPOLAR TRANSISTOR

(71) Applicant: Murata Manufacturing Co., Ltd., Kyoto-fu (JP)

(72) Inventors: Isao Obu, Nagaokakyo (JP); Yasunari Umemoto, Nagaokakyo (JP); Shigeru Yoshida, Nagaokakyo (JP); Masahiro Shibata, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/820,897

(22) Filed: Nov. 22, 2017

(65) Prior Publication Data

US 2018/0097092 A1    Apr. 5, 2018

Related U.S. Application Data

(63) Continuation of application No. 15/610,711, filed on Jun. 1, 2017, now Pat. No. 9,859,405.

(30) Foreign Application Priority Data

Aug. 8, 2016 (JP) .................................. 2016-155800

(51) Int. Cl.
| | |
|---|---|
| *H01L 29/737* | (2006.01) |
| *H01L 29/08* | (2006.01) |
| *H01L 29/12* | (2006.01) |
| *H01L 29/40* | (2006.01) |
| *H01L 29/417* | (2006.01) |
| *H01L 29/66* | (2006.01) |
| *H01L 29/20* | (2006.01) |

(52) U.S. Cl.
CPC ........ *H01L 29/737* (2013.01); *H01L 29/0817* (2013.01); *H01L 29/0821* (2013.01); *H01L 29/12* (2013.01); *H01L 29/20* (2013.01); *H01L 29/401* (2013.01); *H01L 29/41708* (2013.01); *H01L 29/66242* (2013.01); *H01L 29/66318* (2013.01); *H01L 29/7371* (2013.01)

(58) Field of Classification Search
CPC ... H01L 29/0821; H01L 29/737; H01L 29/20; H01L 29/401; H01L 29/66242; H01L 29/12; H01L 29/41708
See application file for complete search history.

(56) References Cited

U.S. PATENT DOCUMENTS

| | | | |
|---|---|---|---|
| 9,859,405 B1 * | 1/2018 | Obu | .................... H01L 29/0817 |
| 2008/0121938 A1 | 5/2008 | Morita et al. | |
| 2012/0199881 A1 | 8/2012 | John et al. | |
| 2017/0186671 A1 | 6/2017 | Sasaki | |

FOREIGN PATENT DOCUMENTS

WO    2015/005037 A1    1/2015

* cited by examiner

*Primary Examiner* — Joseph C. Nicely
(74) *Attorney, Agent, or Firm* — Studebaker & Brackett PC

(57) ABSTRACT

An HBT includes a semiconductor substrate having first and second principal surfaces opposite each other; and a collector layer, a base layer, and an emitter layer stacked in this order on the first principal surface side of the semiconductor substrate. The collector layer includes a first semiconductor layer with metal particles dispersed therein, the metal particles each formed by a plurality of metal atoms bonded with each other.

19 Claims, 37 Drawing Sheets

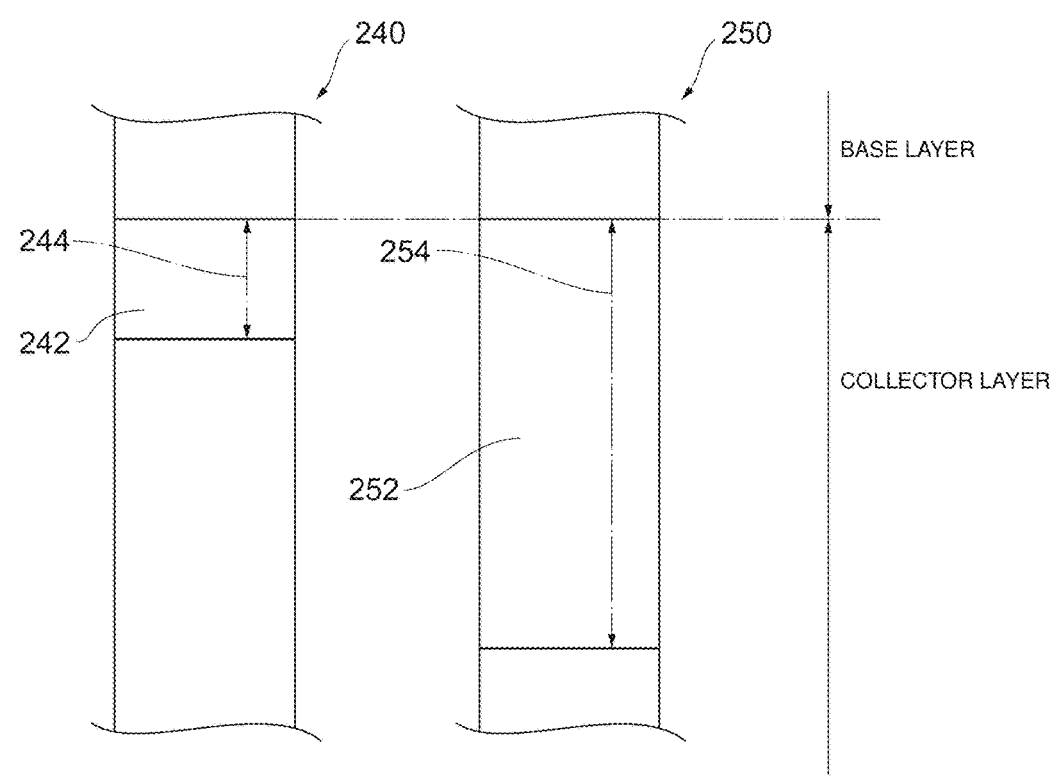

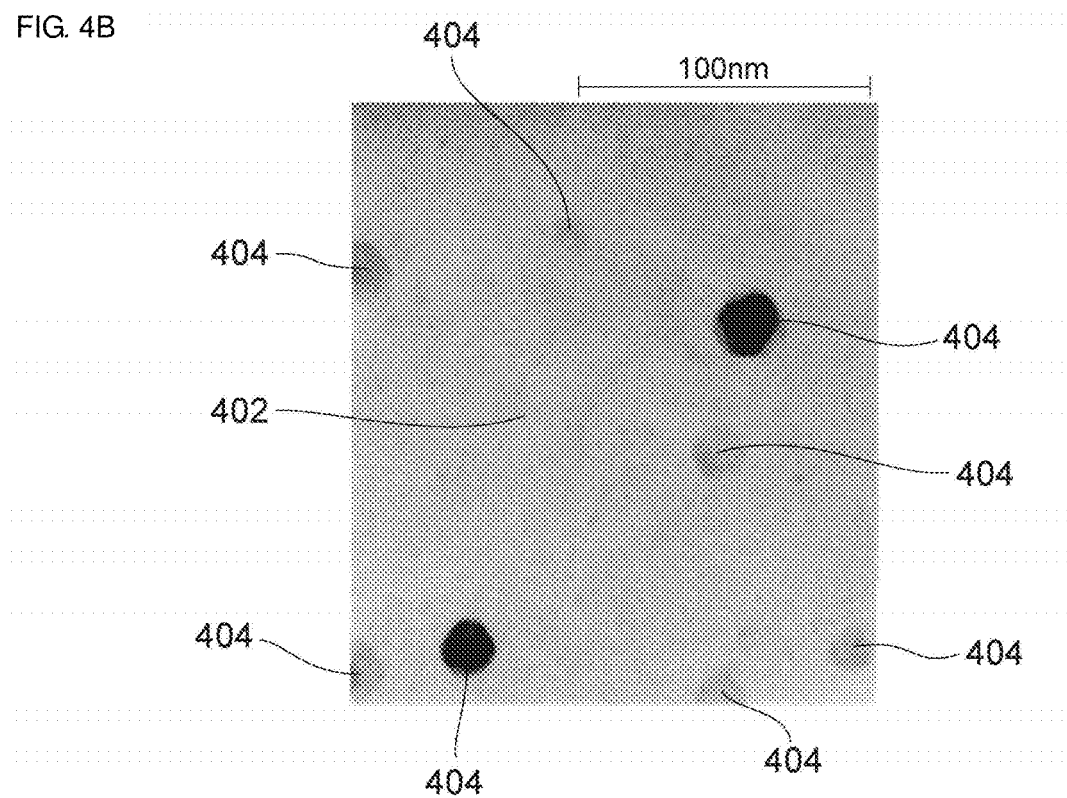

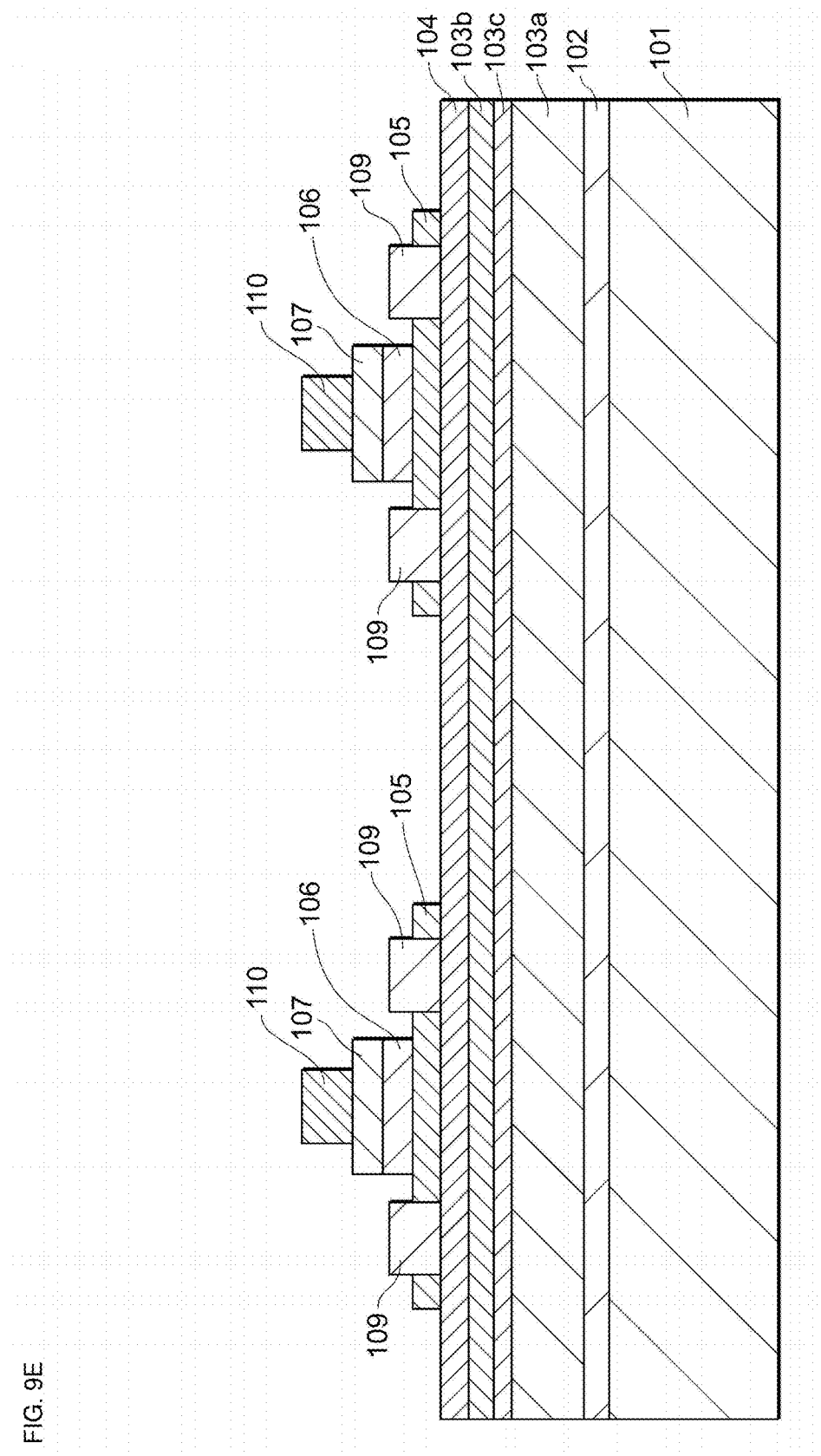

HETEROJUNCTION BIPOLAR TRANSISTOR

CROSS REFERENCE TO RELATED APPLICATIONS

This application is a Continuation Application of U.S. patent application Ser. No. 15/610,711 filed on Jun. 1, 2017, which claims benefit of priority to Japanese Patent Application 2016-155800 filed Aug. 8, 2016, the entire content of which is incorporated herein by reference.

TECHNICAL FIELD

The present disclosure relates to a heterojunction bipolar transistor.

BACKGROUND

A wide variety of mobile communication devices, such as cellular phones, use heterojunction bipolar transistors (HBTs) to amplify the power of the radio frequency (RF) signals they transmit to base stations. When an HBT amplifies high-frequency RF signals, its base-collector capacitance may change with collector voltage, and this change can affect the distortion characteristics of the HBT. For better distortion characteristics, this change in base-collector capacitance needs to be small for a given change in collector voltage (i.e., the collector-voltage dependence of base-collector capacitance needs to be low). For example, International Publication No. 2015/005037 discloses an HBT that features a collector layer having a unique doping profile, which makes its base-collector capacitance less dependent on its collector voltage.

SUMMARY

In the fabrication of the HBT disclosed in International Publication No. 2015/005037, a collector layer is formed in accordance with a complicated doping profile. The fabrication process therefore involves a complicated doping step for the production of the collector layer. Due to the resulting lack of control stability, this HBT can be mass-produced only with a low yield.

Accordingly, it is an object of the present disclosure to provide an HBT that combines stable control of its fabrication and a low collector-voltage dependence of base-collector capacitance.

According to preferred embodiments of the present disclosure, an HBT includes a semiconductor substrate having first and second principal surfaces opposite each other; and a collector layer, a base layer, and an emitter layer stacked in this order on a first principal surface side of the semiconductor substrate. The collector layer includes a first semiconductor layer with metal particles dispersed therein, the metal particles each formed by a plurality of metal atoms bonded with each other.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIG. 2C is a schematic diagram of the expansion of a depletion region in the collector layer of a typical HBT.

FIG. 4B is an enlarged view of the transmission electron microscopic image of GaAs with particles of As dispersed therein.

FIG. 9E is a diagram illustrating a procedure for the fabrication of HBTs 100C, HBTs according to a variation of Embodiment 1 of the present disclosure.

DETAILED DESCRIPTION

The following describes some embodiments of the present disclosure in more detail with reference to the drawings. Like elements are given like numerals throughout and described only once in the following.

Figure 1:
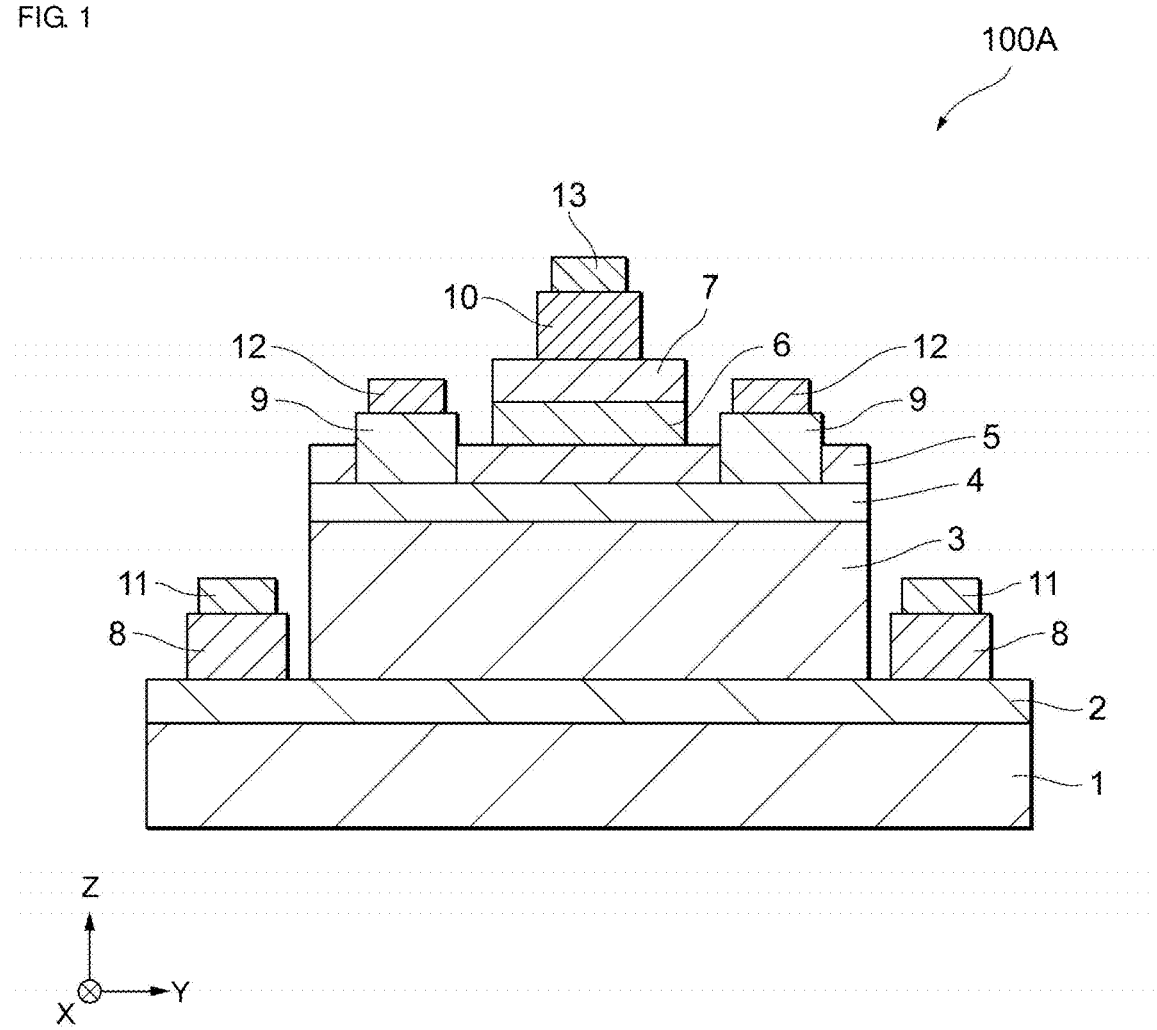
FIG. 1 is a cross-sectional view of an HBT 100A, an HBT according to Embodiment 1 of the present disclosure.

First, an HBT according to Embodiment 1 of the present disclosure is described with reference to FIGS. 1 to 5B. FIG. 1 is a cross-sectional view of an HBT 100A, an HBT according to Embodiment 1 of the present disclosure. The HBT 100A, formed on a semiconductor substrate 1, includes a subcollector layer 2, a collector layer 3, a base layer 4, an emitter layer 5, contact layers 6 and 7, and other components such as electrodes and wiring.

The semiconductor substrate 1, made of GaAs for example, has a width direction parallel to the Y axis, a depth direction parallel to the X axis, and a thickness direction parallel to the Z axis. The semiconductor substrate 1 has two opposite principal surfaces parallel to the XY plane, a first principal surface (on the positive side of the Z axis) and a second principal surface (on the negative side of the Z axis). GaAs is not the only possible material for the semiconductor substrate 1, and materials such as Si, InP, SiC, and GaN can also be used.

On the first principal surface side of the semiconductor substrate 1 are stacked a subcollector layer 2, a collector layer 3, a base layer 4, an emitter layer 5, a contact layer 6, and a contact layer 7 in this order in the positive direction of the Z axis. The materials, doping concentrations, thicknesses, and other details given below are for illustrative purposes and not meant to be limiting.

The subcollector layer 2 is on the semiconductor substrate 1. The subcollector layer 2 can be made of any material, and an example is a material that has a crystal structure. The subcollector layer 2 serves as a collector together with the collector layer 3.

The collector layer 3 (a first semiconductor layer) is on the subcollector layer 2. The collector layer 3 can be made of any material, and an example is a material that has a crystal structure. In this embodiment, the subcollector layer 2 and the collector layer 3 are, for example, GaAs-based layers.

The subcollector and collector layers can be either n-type or p-type semiconductors. If the subcollector and collector layers are n-type semiconductors, the HBT is an npn transistor. If the subcollector and collector layers are p-type semiconductors, the HBT is a pnp transistor. Preferably, the HBT is an npn transistor. Given that GaAs carries electrons more quickly than holes (electron mobility, about 0.85 $m^2$/Vs; hole mobility, about 0.04 $m^2$/Vs), the HBT would have better frequency characteristics when formed as an npn transistor than as a pnp transistor. Dopants such as Si, S, Se, Te, and Sn make the doped semiconductor layer n-type, and dopants such as C, Mg, Be, and Zn make the doped semiconductor layer p-type. This embodiment assumes that the subcollector layer 2 is an n-type semiconductor and that the collector layer 3 is an undoped layer. Specifically, the subcollector layer 2 is, for example, an about 600-nm-thick layer with a Si doping concentration of about $5 \times 10^{18}$ $cm^{-3}$, and the collector layer 3 has a thickness of, for example, about 1.0 μm. The collector layer 3 may alternatively be a doped n-type semiconductor with a concentration of an n-type dopant (e.g., Si) of about $1 \times 10^{17}$ $cm^{-3}$ or less. The detailed structure of the collector layer 3 will be described hereinafter.

The base layer 4 is on the collector layer 3. The base layer 4 can be made of any material. For example, it can be made of a material such as GaAs, AlGaAs, InGaAs, GaAsSb, GaAsPBi, GaInNAs, GaAsBi, GaAsN, or GaAsBiN. The base layer 4 may have various structures, such as a multi-layer structure that is a combination of layers made from some of the materials listed above, a structure with a gradient of composition, and a structure with a gradient of doping concentration. In this embodiment, the base layer 4 is, for example, a GaAs-based layer, similar to the subcollector layer 2 and the collector layer 3.

The GaAs as the principal component of the base layer 4 can be either an n-type or p-type semiconductor. In this embodiment, the GaAs for the base layer 4 is a p-type semiconductor because the subcollector layer 2 is an n-type semiconductor. The base layer 4 has a C doping concentration of about $5 \times 10^{19}$ $cm^{-3}$ and a thickness of about 96 nm.

The emitter layer 5 is on the base layer 4. The emitter layer 5 can be made of any semiconductor. For example, it can be made of a material such as InGaP or AlGaAs. In this embodiment, it is preferred that the emitter layer 5 be made of a semiconductor whose principal component is lattice-matched with that of the base layer 4 so that the emitter layer 5 can form a heterojunction with the base layer 4. In this embodiment, the emitter layer 5 is, for example, an InGaP-based n-type semiconductor with an InP molar ratio of about 0.48, a Si doping concentration of about $4 \times 10^{17}$ $cm^{-3}$, and a thickness of about 35 nm.

Part of the emitter layer 5 is covered with contact layers 6 and 7. The contact layer 6 is, for example, a GaAs-based n-type semiconductor with a Si doping concentration of about $5 \times 10^{18}$ $cm^{-3}$ and a thickness of about 50 nm. The contact layer 7 is, for example, an InGaAs-based n-type semiconductor with an InAs molar ratio of about 0.5, a Si doping concentration of about $1\times10^{19}$ cm$^{-3}$, and a thickness of about 50 nm. The HBT 100A does not need to have both contact layers 6 and 7 and may have semiconductor layers different from these contact layers.

Furthermore, there are a pair of collector electrodes 8 on the subcollector layer 2 with the collector layer 3 therebetween, one on one side in the direction of the width of the subcollector layer 2 (the direction of the Y axis) and the other on the other side. Alternatively, there may be a collector electrode 8 on the subcollector layer 2 only on one side with respect to the collector layer 3. The collector electrodes 8 can be made of any material, and an example is AuGe/Ni/Au. In this embodiment, the collector electrodes 8 are AuGe (about 60 nm thick)/Ni (about 10 nm thick)/Au (about 200 nm thick) electrodes. Each slash "/" represents an interface between two materials in a multilayer structure. For example, "AuGe/Ni" means that a Ni layer exists on a AuGe layer. The same applies hereinafter.

There are base electrodes 9 on the base layer 4. The base electrodes 9 can be made of any material, and an example is Ti/Pt/Au. In this embodiment, the base electrodes 9 are Ti (about 50 nm thick)/Pt (about 50 nm thick)/Au (about 200 nm thick) electrodes.

There is an emitter electrode 10 on the contact layer 7. The emitter electrode 10 can be made of any material, and examples include Mo/Ti/Pt/Au, WSi, and AuGe/Ni/Au. In this embodiment, the emitter electrode 10 is a Mo (about 10 nm thick)/Ti (about 5 nm thick)/Pt (about 30 nm thick)/Au (about 200 nm thick) electrode.

There are collector wiring 11, base wiring 12, and emitter wiring 13 on the collector electrodes 8, the base electrodes 9, and the emitter electrode 10, respectively.

Figure 2A:
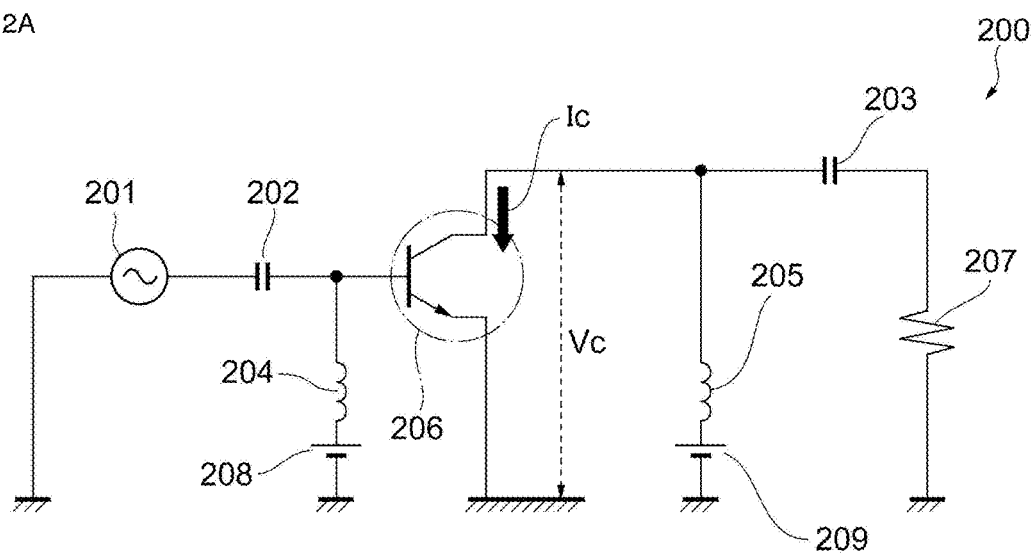
FIG. 2A is an example of a circuit diagram for a power amplifier circuit in which a typical HBT is used.
Figure 2B:
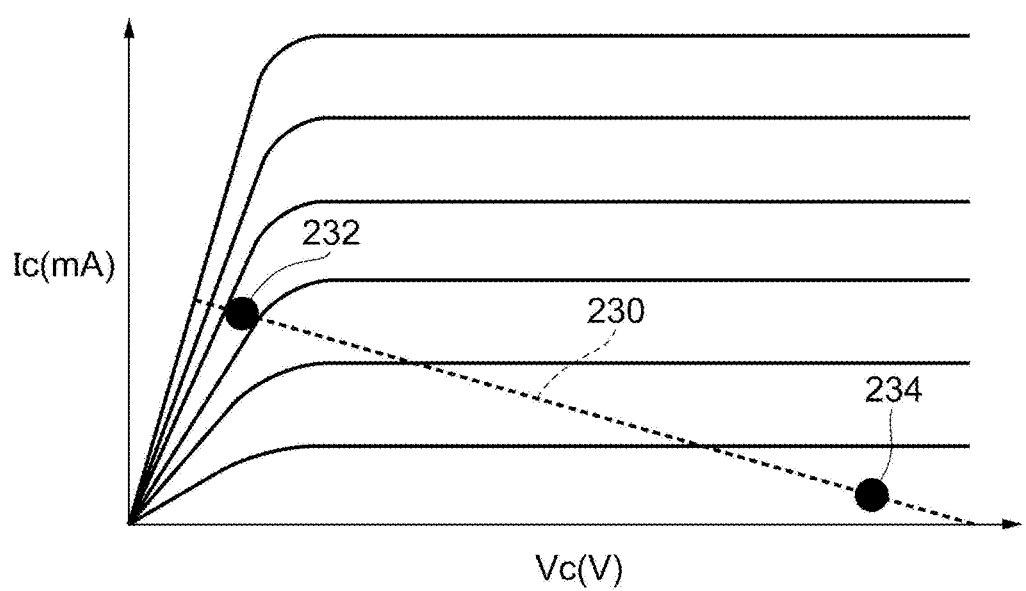
FIG. 2B is a graphical representation of collector voltage Vc versus collector current Ic for a typical HBT.

The following describes the collector-voltage dependence of the base-collector capacitance Cbc of HBTs with reference to FIGS. 2A to 2C and FIG. 3 before detailing the collector layer 3. FIG. 2A is an example of a circuit diagram for a power amplifier circuit in which a typical HBT is used, FIG. 2B is a graphical representation of collector voltage Vc versus collector current Ic for a typical HBT, and FIG. 2C is a schematic diagram that illustrates the expansion of a depletion region in the collector layer of a typical HBT. In the graph in FIG. 2B, the vertical and horizontal axes are for collector current Ic (mA) and collector voltage Vc (V), respectively. This graph represents Vc-Ic profiles with different base currents.

The power amplifier circuit 200 illustrated in FIG. 2A includes a high-frequency signal source 201, capacitors 202 and 203, inductors 204 and 205, an HBT 206, a load resistor 207, a base bias power supply 208, and a collector bias power supply 209. In the power amplifier circuit 200, the RF signal output from the high-frequency signal source 201 goes to the base of the emitter-grounded HBT 206 via the capacitor 202. The HBT 206 amplifies the RF signal and outputs the amplified signal from the collector. As can be seen from FIG. 2B, the collector voltage Vc and collector current Ic of the HBT 206 are given by operating points on a load line 230, which is determined by the load resistor 207. The following describes the structures the collector layer has at these operating points.

FIG. 2C illustrates depletion widths in the collector layer at the operating points 232 and 234 (see FIG. 2B), examples of operating points of the HBT 206. Specifically, the schematic diagram 240 illustrates the width of a depletion region 242 in the collector layer at the operating point 232 in FIG. 2B, whereas the schematic diagram 250 illustrates that of a depletion region 252 in the collector layer at the operating point 234 in FIG. 2B. At the operating point 232, the depletion width 244 in the collector layer is relatively small because of the relatively low collector voltage Vc (see FIG. 2B) and the resulting small reverse bias applied to the base-collector junction (a pn junction). At the operating point 234, the depletion width 254 in the collector layer is relatively large because of the relatively high collector voltage Vc (see FIG. 2B) and the resulting large reverse bias applied to the base-collector junction (a pn junction). In a typical HBT, therefore, the depletion width in the collector layer changes with collector voltage Vc.

The following describes the relationship between depletion width and base-collector capacitance. When the doping concentration in the base layer is sufficiently higher than that in the collector layer, the base-collector capacitance Cbc is approximated by equation (1):

$$Cbc = \varepsilon \times \varepsilon_0 \times (S/W) \qquad (1)$$

where $\varepsilon$ is the relative permittivity of the material for the collector layer, $\varepsilon_0$ is the vacuum permittivity, S is the area of the base-collector junction, and W is the depletion width in the collector layer.

As can be seen from equation (1), the base-collector capacitance Cbc increases with decreasing depletion width W in the collector layer, and decreases with increasing depletion width W in the collector layer.

In summary, a change in collector voltage leads to a change in the depletion width W in the collector layer, and the change in the depletion width W leads to a change in base-collector capacitance Cbc. Specifically, the base-collector capacitance Cbc decreases with increasing collector voltage, and increases with decreasing collector voltage. This is the principle behind the collector-voltage dependence of base-collector capacitance Cbc.

Figure 3:
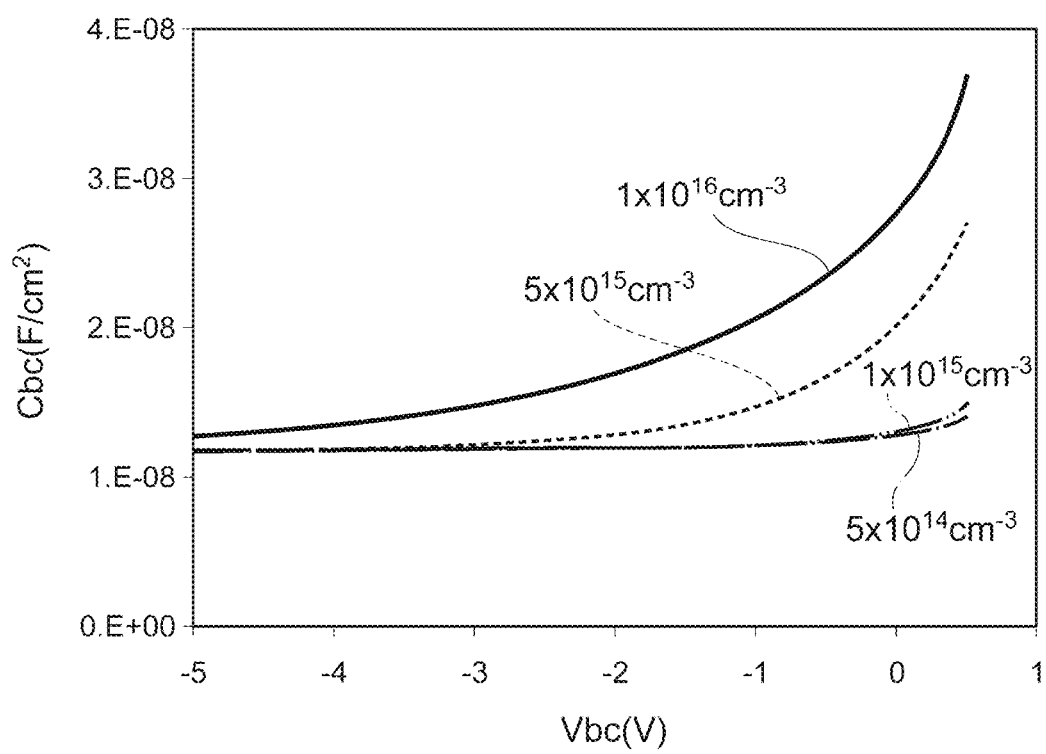
FIG. 3 is a graphical representation of simulated relationships between base-collector voltage Vbc and base-collector capacitance Cbc for a typical HBT.

FIG. 3 is a graphical representation of simulated relationships between base-collector voltage Vbc and base-collector capacitance Cbc for a typical HBT. This simulation assumes a typical HBT including a stack of subcollector, collector, and base layers (structurally similar to a pn-junction diode) and voltage applied across the subcollector and base layers. In the graph in FIG. 3, the vertical and horizontal axes are for base-collector capacitance Cbc (F/cm$^2$) and base-collector voltage Vbc (V), respectively. The subcollector layer is a GaAs-based n-type semiconductor (Si doping concentration, about $5\times10^{18}$ cm$^{-3}$; thickness, about 600 nm), the collector layer is a GaAs-based n-type semiconductor (thickness, about 1.0 µm), and the base layer is a GaAs-based p-type semiconductor (C doping concentration, about $5\times10^{19}$ cm$^{-3}$; thickness, about 96 nm). The collector layer has four Si doping concentrations: about $1\times10^{16}$ cm$^{-3}$, about $5\times10^{15}$ cm$^{-3}$, about $1\times10^{15}$ cm$^{-3}$, and about $5\times10^{14}$ cm$^{-3}$. The activation ratio for each dopant (the ratio of the free electron concentration to the doping concentration) is about 1.

As can be seen from FIG. 3, the base-collector capacitance Cbc becomes less dependent on voltage with decreasing doping concentration in the collector layer. With a doping concentration in the collector layer of about $1\times10^{16}$ cm$^{-3}$ or about $5\times10^{15}$ cm$^{-3}$ in particular, the base-collector capacitance Cbc sharply increases with increasing base-collector voltage Vbc, indicating high collector-voltage dependence of base-collector capacitance Cbc. Limiting the doping concentration in the collector layer to about $1\times10^{15}$ cm$^{-3}$ or less would therefore make the collector-voltage dependence of base-collector capacitance Cbc sufficiently low. In actual formation of a collector layer (through epitaxial crystal growth, for example), however, impurities taken in from the growth atmosphere make it difficult to limit the doping concentration in the collector layer to about $1 \times 10^{15}$ cm$^{-3}$ or less through impurity control. The following describes the detailed structure of the collector layer 3 according to this embodiment of the disclosure in this regard.

In this embodiment, the collector layer is a GaAs-based layer with metal particles dispersed therein. The term "metal" as used herein includes metals and nonmetals similar in nature to metals (what are called metalloids). Metalloids are chemical elements that provide metallic electrical conduction, such as boron (B), silicon (Si), germanium (Ge), arsenic (As), antimony (Sb), and tellurium (Te). The term "particle" as used herein refers to a fine particle formed by multiple atoms bonded with each other. Unbound atoms are therefore not particles. The following discusses particles of As, formed by multiple As atoms bounded with each other, as an example of metal particles.

Figure 4A:
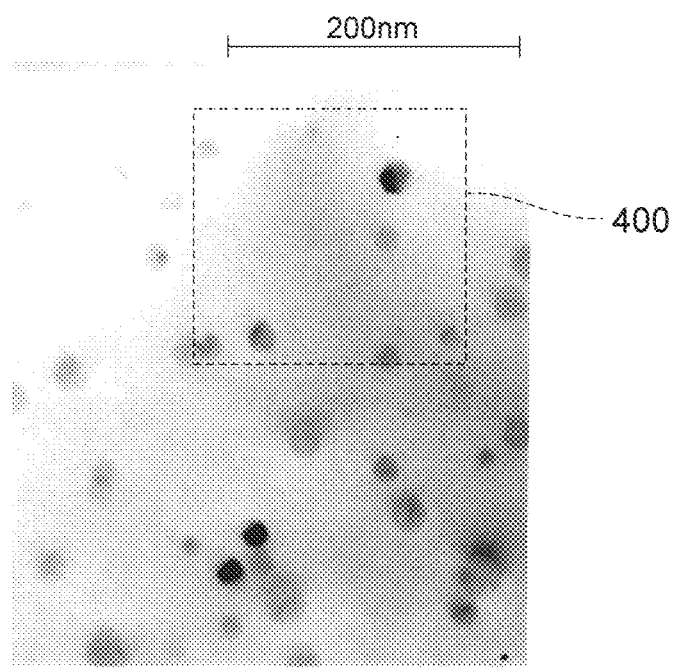
FIG. 4A is a transmission electron microscopic image of GaAs with particles of As dispersed therein.

FIGS. 4A and 4B are transmission electron microscopic images of GaAs with particles of As dispersed therein, and FIG. 4B is an enlarged view of the region 400 in FIG. 4A. As seen from FIGS. 4A and 4B, a GaAs matrix 402 contains As particles 404 dispersed therein. The As particles 404 measure, for example, about 18 to 22 nm across.

Figure 5A:
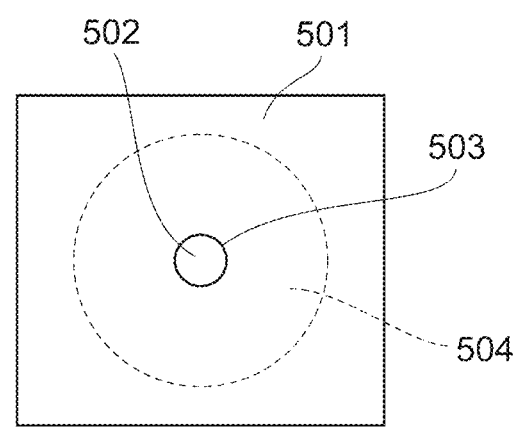
FIG. 5A is a schematic view of one particle of As and its surroundings.
Figure 5B:
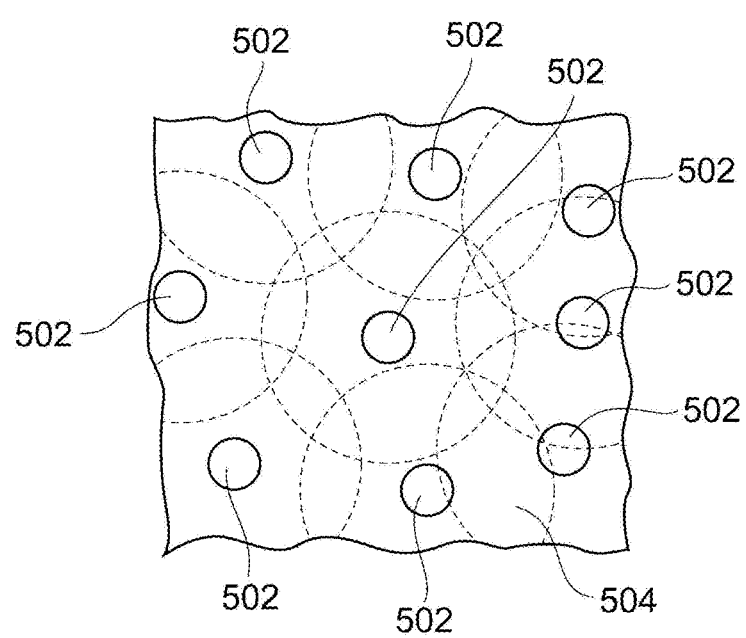
FIG. 5B is a schematic view of multiple particles of As and their surroundings.

FIG. 5A is a schematic view of one particle of As and its surroundings, and FIG. 5B is a schematic view of multiple particles of As and their surroundings. In FIG. 5A, a GaAs matrix 501 contains an As particle 502. The As particle 502, similar in nature to metals, forms a Schottky junction 503 at the interface with the GaAs matrix 501, creating a depletion region 504 around the interface. When GaAs contains multiple As particles 502 dispersed therein as in FIG. 5B, depletion regions 504 created around the individual As particles 502 combine to make the entire GaAs depleted. A GaAs-based collector layer with As particles dispersed therein therefore has a wide depletion region, regardless of how much the base-collector junction is reverse-biased.

The depletion region formed in the collector layer extends, for example, to the subcollector layer. When the doping concentration in the subcollector layer is relatively high (about $5 \times 10^{18}$ cm$^{-3}$ in this embodiment), it is rare for the depletion region reaching the subcollector layer to grow beyond the subcollector layer, even if the reverse bias applied to the base-collector junction is increased. The collector layer remains completely depleted of whatever the collector voltage is. In a GaAs-based collector layer with As particles dispersed therein, therefore, the depletion width is little dependent on the collector voltage, even if the doping concentration in the collector layer is relatively high (e.g., about $1 \times 10^{16}$ cm$^{-3}$ or more). As a result, the collector-voltage dependence of base-collector capacitance Cbc is low.

By virtue of this structure, the HBT 100A has a base-collector capacity little dependent on collector voltage without needing a collector layer formed in accordance with a complicated doping profile such as that disclosed in International Publication No. 2015/005037. This HBT, therefore, combines a low collector-voltage dependence of base-collector capacity with stable control of its fabrication, and therefore improved yield, in mass production.

Figure 6:
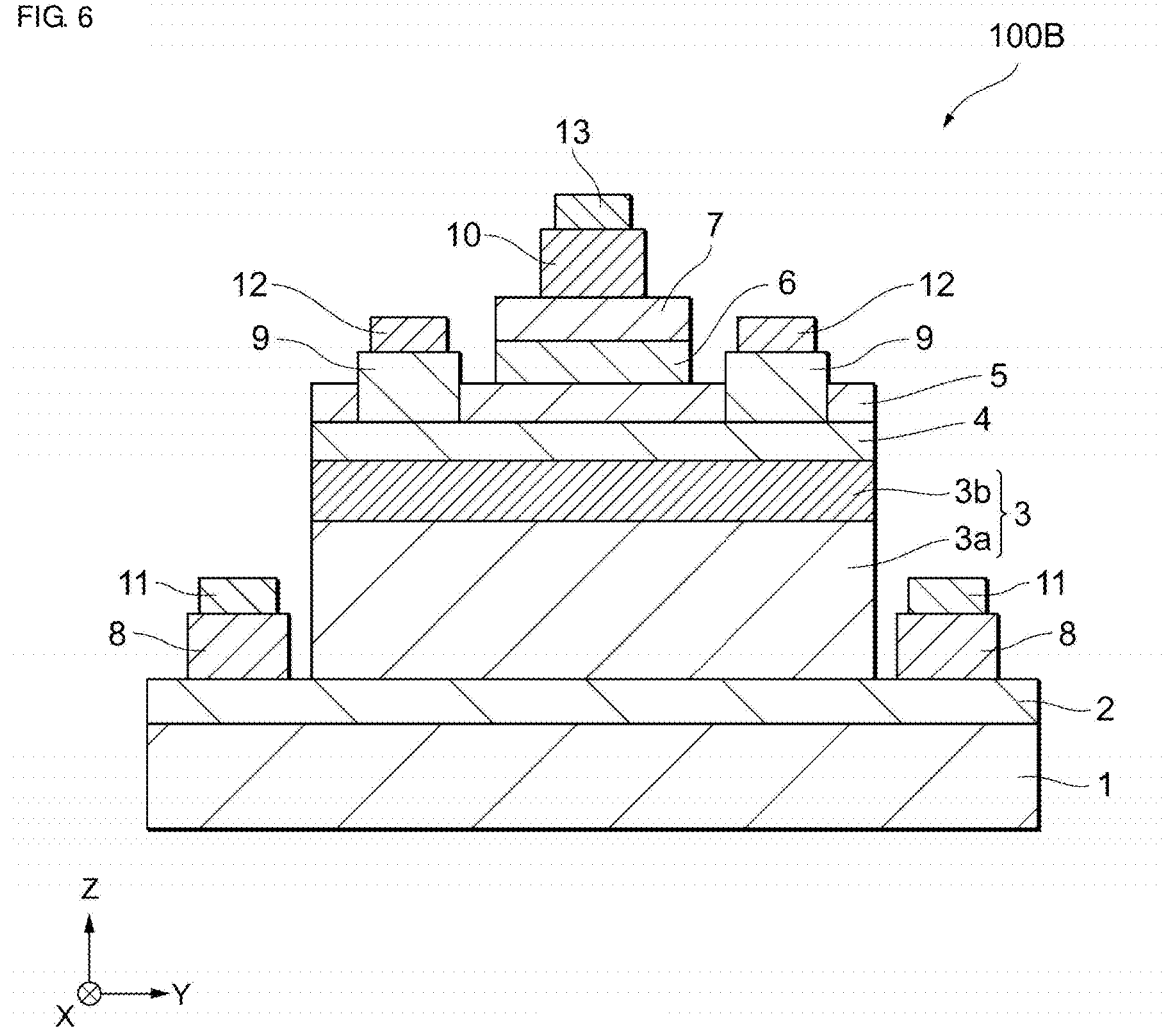
FIG. 6 is a cross-sectional view of an HBT 100B, an HBT according to a variation of Embodiment 1 of the present disclosure.

FIG. 6 is a cross-sectional view of an HBT 100B, an HBT according to a variation of Embodiment 1 of the present disclosure. Compared with the HBT 100A, illustrated in FIG. 1, the HBT 100B has a first collector layer 3a and a second collector layer 3b in the collector layer 3. The first collector layer 3a is the same as the collector layer 3 in FIG. 1 and is not described in detail.

The second collector layer 3b (a second semiconductor layer) is between the first collector layer 3a (first semiconductor layer) and the base layer 4. The second collector layer 3b can be made of any material. For example, it can be a GaAs-based n-type semiconductor with a Si doping concentration of about $7 \times 10^{17}$ cm$^{-3}$ and a thickness of about 10 nm. The second collector layer 3b is depleted even under unbiased conditions because of a built-in potential formed in the base-collector junction region. The second collector layer 3b may have a higher doping concentration than the first collector layer 3a, and may be thinner than the base layer 4.

In this embodiment, the second collector layer 3b interposed between the first collector layer 3a and the base layer 4 limits the Kirk effect, an effect that occurs at an increased current density and in which a space charge region formed at the junction between the collector layer 3 and the base layer 4 is pushed to the collector layer 3 side. The related degradation of the high-frequency characteristics of the HBT is thus controlled, including a loss of power gain and a decrease in cut-off frequency.

In such a structure, the HBT 100B still has the same advantages as the HBT 100A. Furthermore, the second collector layer 3b of the HBT 100B limits the Kirk effect, providing control over the related degradation of high-frequency characteristics.

Figure 7:
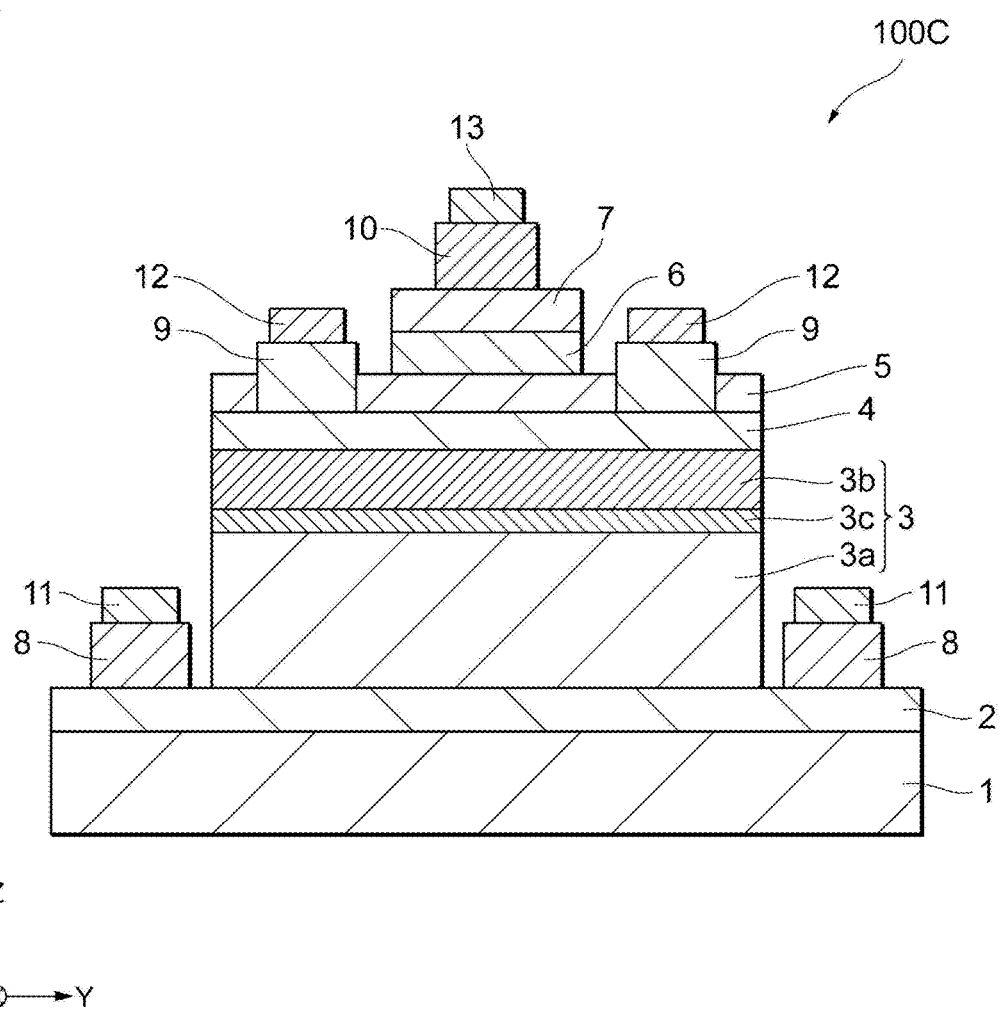
FIG. 7 is a cross-sectional view of an HBT 100C, an HBT according to another variation of Embodiment 1 of the present disclosure.

FIG. 7 is a cross-sectional view of an HBT 100C, an HBT according to another variation of Embodiment 1 of the present disclosure. Compared with the HBT 100B, illustrated in FIG. 6, the HBT 100C has a barrier layer 3c between the first collector layer 3a and second collector layer 3b in the collector layer 3.

The barrier layer 3c (a third semiconductor layer) is between the first collector layer 3a (first semiconductor layer) and the second collector layer 3b (second semiconductor layer). The barrier layer 3c can be made of any material. For example, it can be an AlGaAs-based undoped layer with an AlAs molar ratio of about 0.3 and a thickness of about 30 nm. The barrier layer 3c may be thinner than the base layer 4.

In the first collector layer 3a, there may be a relatively large number of point defects. These point defects can diffuse to reach the base layer 4 when the HBT is operated, and the resulting increased occurrence of electron-hole recombination within the base layer 4 may affect the current gain and/or reliability of the HBT. In this embodiment, the barrier layer 3c interposed between the first collector layer 3a and the base layer 4 prevents point defects from reaching the base layer 4, limiting the related loss of the current gain and/or reliability of the HBT. Preferably, the barrier layer 3c has an AlAs molar ratio of about 0.3 or more. This leads to more effective prevention of the diffusion of point defects.

In such a structure, the HBT 100C still has the same advantages as the HBT 100B. Furthermore, the HBT 100C is improved compared with the HBTs 100A and 100B in terms of loss of current gain and reliability. The barrier layer 3c may be on the second collector layer 3b (on the positive side of the Z axis), and the second collector layer 3b is optional for this HBT 100C.

Figure 8:
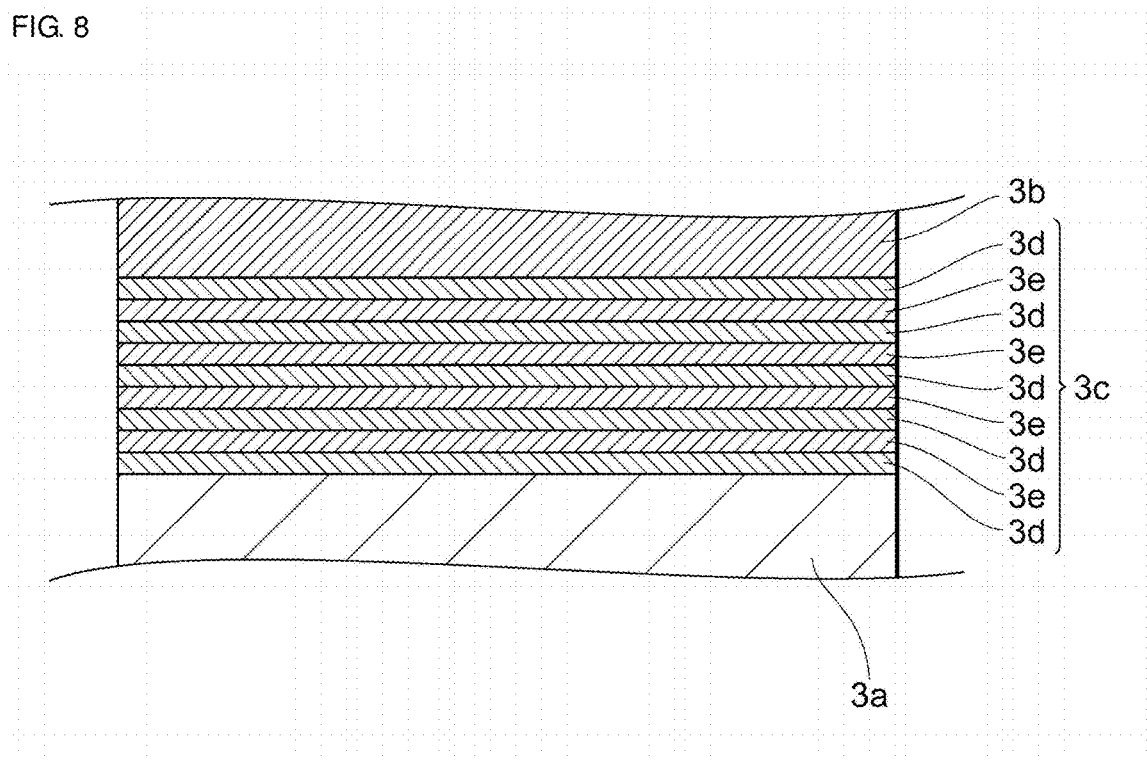
FIG. 8 is a partial cross-sectional view of an HBT 100D, an HBT according to yet another variation of Embodiment 1 of the present disclosure.

FIG. 8 is a partial cross-sectional view of an HBT 100D, an HBT according to yet another variation of Embodiment 1 of the present disclosure. Compared with the HBT 100C, illustrated in FIG. 7, the HBT 100D has a multilayer barrier layer 3c.

The barrier layer 3c includes multiple barrier layers 3d and 3e. Specifically, barrier layers 3d and barrier layers 3e alternate to form a superlattice. The barrier layers 3d and 3e can be made of any material. For example, the barrier layers 3d are AlGaAs-based undoped layers (AlAs molar ratio, about 0.3; thickness, about 5 nm), and the barrier layers 3e are GaAs-based undoped layers (thickness, about 5 nm). The barrier layers 3d preferably have an AlAs molar ratio of about 0.3 or more. The number of barrier layers 3d and that of barrier layers 3e are not critical.

In such a structure, the HBT 100D still has the same advantages as the HBT 100B. Similar to the HBT 100C, the HBT 100D has a barrier layer 3c between the first collector layer 3a and the base layer 4. The barrier layer 3c prevents point defects from reaching the base layer 4, limiting the related loss of the current gain and/or reliability of the HBT. The barrier layer 3c may be on the second collector layer 3b (on the positive side of the Z axis), and the second collector layer 3b is optional for this HBT 100D.

The following describes the fabrication of HBTs 100C, HBTs according to a variation of Embodiment 1 of the present disclosure, with reference to FIGS. 9A to 9I. FIGS. 9A to 9I are diagrams illustrating a procedure for the fabrication of HBTs 100C, HBTs according to a variation of Embodiment 1 of the present disclosure. The diagrams of FIGS. 9A to 9I, having the same orientation as the cross-sectional view of an HBT 100C in FIG. 7, illustrate an example case in which two adjacent HBTs 100C (an HBT 100C-1 and an HBT 100C-2) are fabricated. The materials for the individual components are as in the above description and are not described in detail.

Figure 9A:
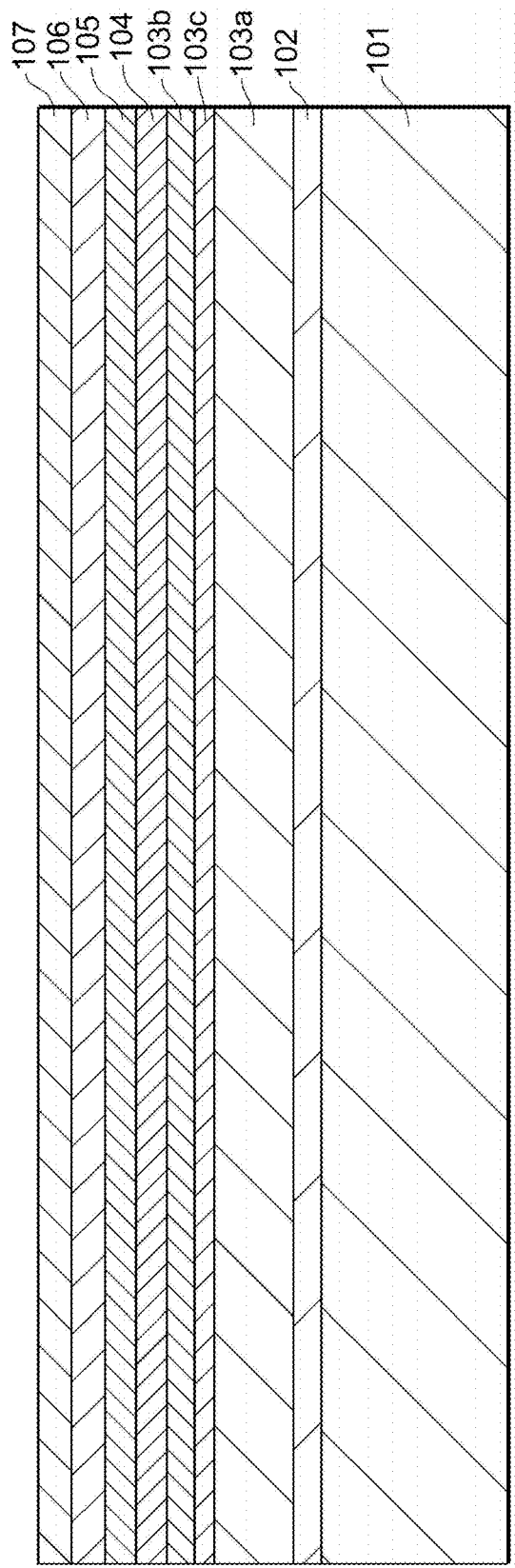
FIG. 9A is a diagram illustrating a procedure for the fabrication of HBTs 100C, HBTs according to a variation of Embodiment 1 of the present disclosure.

First, as in FIG. 9A, atop a semiconductor substrate 101 are formed a subcollector layer 102, a first collector layer 103a, a barrier layer 103c, a second collector layer 103b, a base layer 104, an emitter layer 105, and contact layers 106 and 107 in this order, by gas-source molecular beam epitaxy (gas-source MBE) for example, to give a multilayer structure.

Figure 9B:
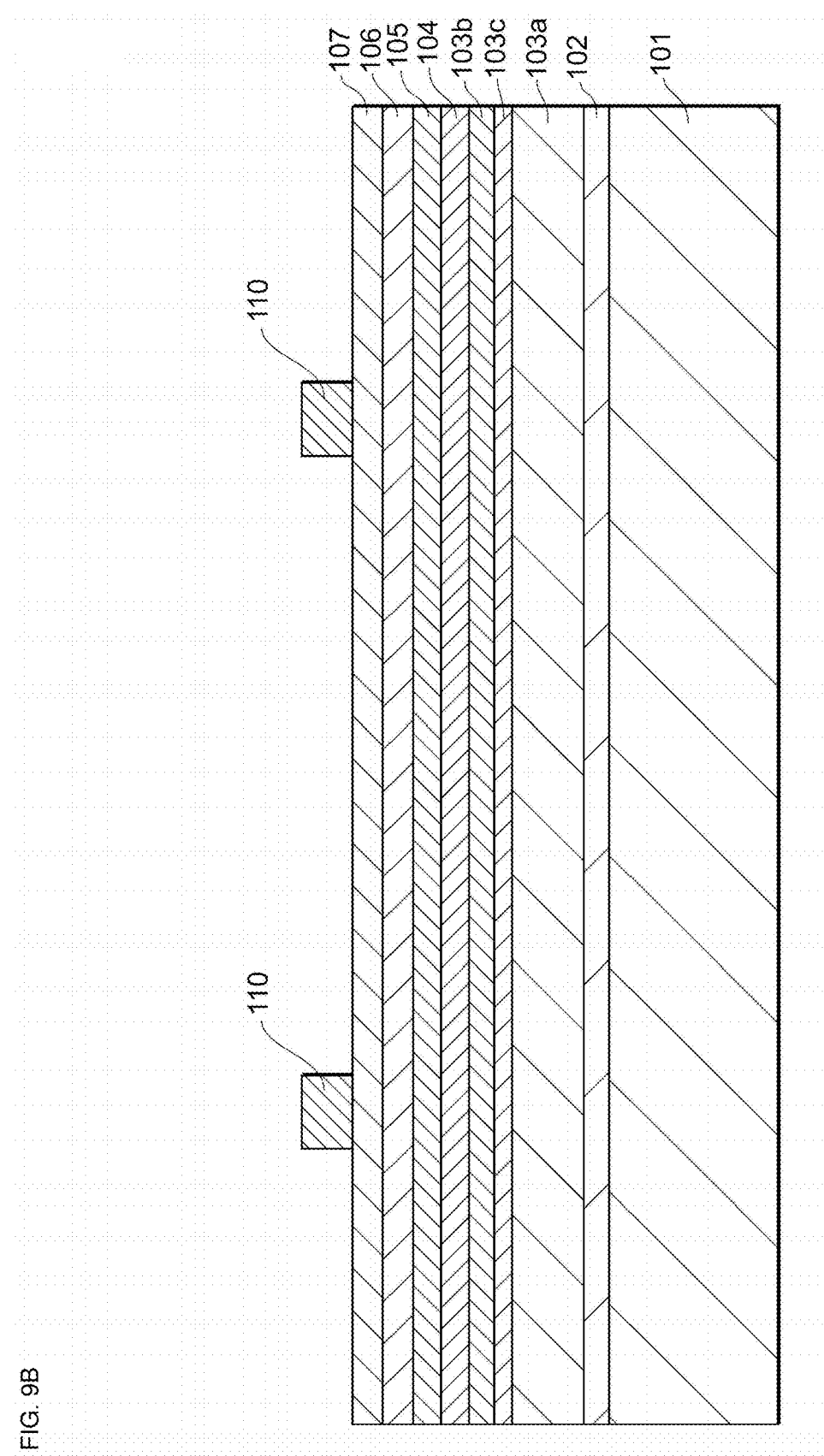
FIG. 9B is a diagram illustrating a procedure for the fabrication of HBTs 100C, HBTs according to a variation of Embodiment 1 of the present disclosure.

Then, as in FIG. 9B, emitter electrodes 110 are formed, by photolithography, deposition, and lift-off for example, on the contact layer 107 in predetermined areas.

Figure 9C:
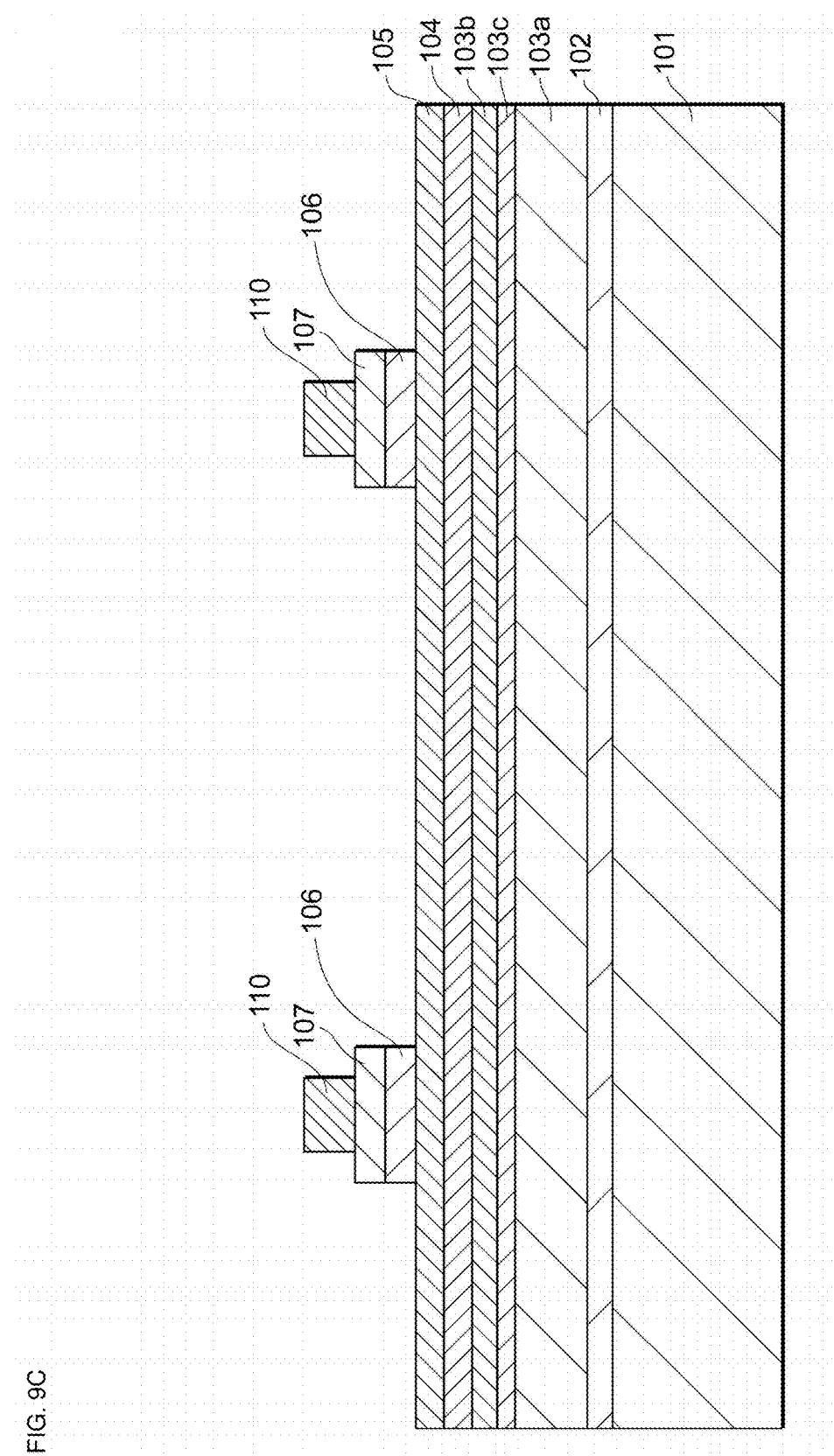
FIG. 9C is a diagram illustrating a procedure for the fabrication of HBTs 100C, HBTs according to a variation of Embodiment 1 of the present disclosure.

Then, as in FIG. 9C, the contact layers 107 and 106 are removed, by photolithography (the photoresist not illustrated) and wet etching for example, in predetermined areas to expose the surface of the emitter layer 105 (the principal surface of the emitter layer 105 on the positive side of the Z axis; the same applies hereinafter). The wet etchant can be an about 1:2:40 mixture of phosphoric acid, hydrogen peroxide, and water, with which the etching stops at the surface of the emitter layer 105. That is, the emitter layer 105 may have the capability to stop etching.

Figure 9D:
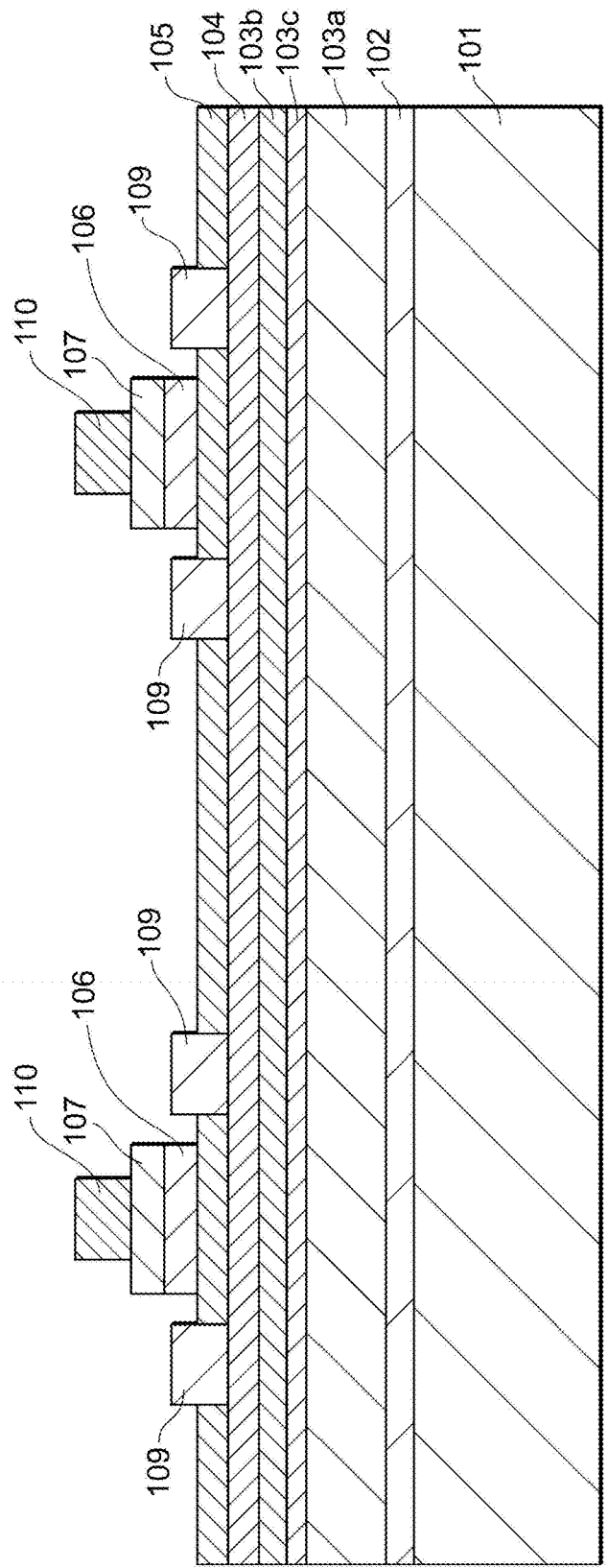
FIG. 9D is a diagram illustrating a procedure for the fabrication of HBTs 100C, HBTs according to a variation of Embodiment 1 of the present disclosure.

Then, as in FIG. 9D, base electrodes 109 are formed, by photolithography, deposition, and lift-off for example, on both sides of each remaining portion of the contact layer 106 to reach the base layer 104 through the emitter layer 105.

Then, as in FIG. 9E, unnecessary portions of the emitter layer 105 are removed, by wet etching for example, to expose the surface of the base layer 104. The wet etchant can be hydrochloric acid, with which the etching stops at the surface of the base layer 104.

Figure 9F:
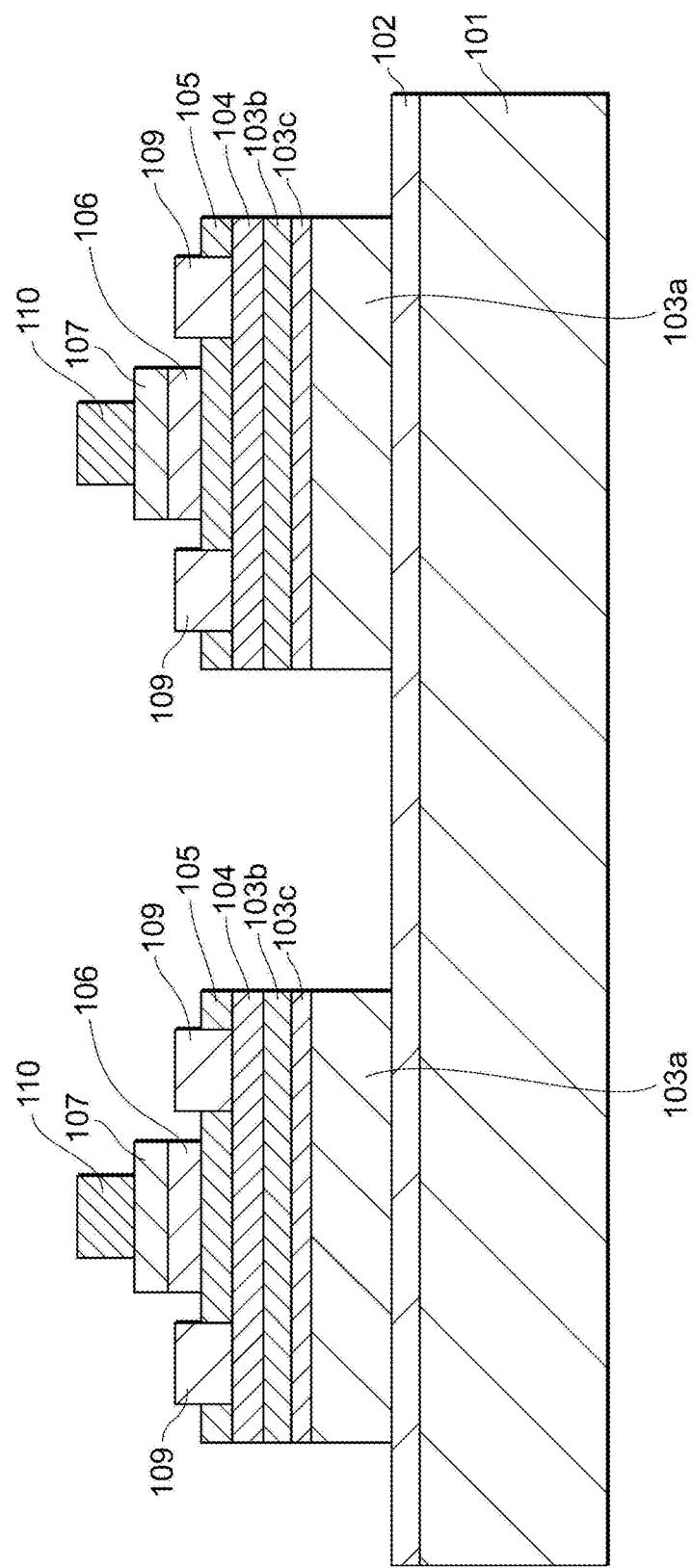
FIG. 9F is a diagram illustrating a procedure for the fabrication of HBTs 100C, HBTs according to a variation of Embodiment 1 of the present disclosure.

Then, as in FIG. 9F, the base layer 104, second collector layer 103b, barrier layer 103c, and first collector layer 103a are removed, by wet etching for example, to expose the surface of the subcollector layer 102. The photoresist in FIG. 9E serves as a mask. When wet etching is used, the etchant can be, for example, an about 1:2:40 mixture of phosphoric acid, hydrogen peroxide, and water, and the etching process may be stopped at a particular time.

Figure 9G:
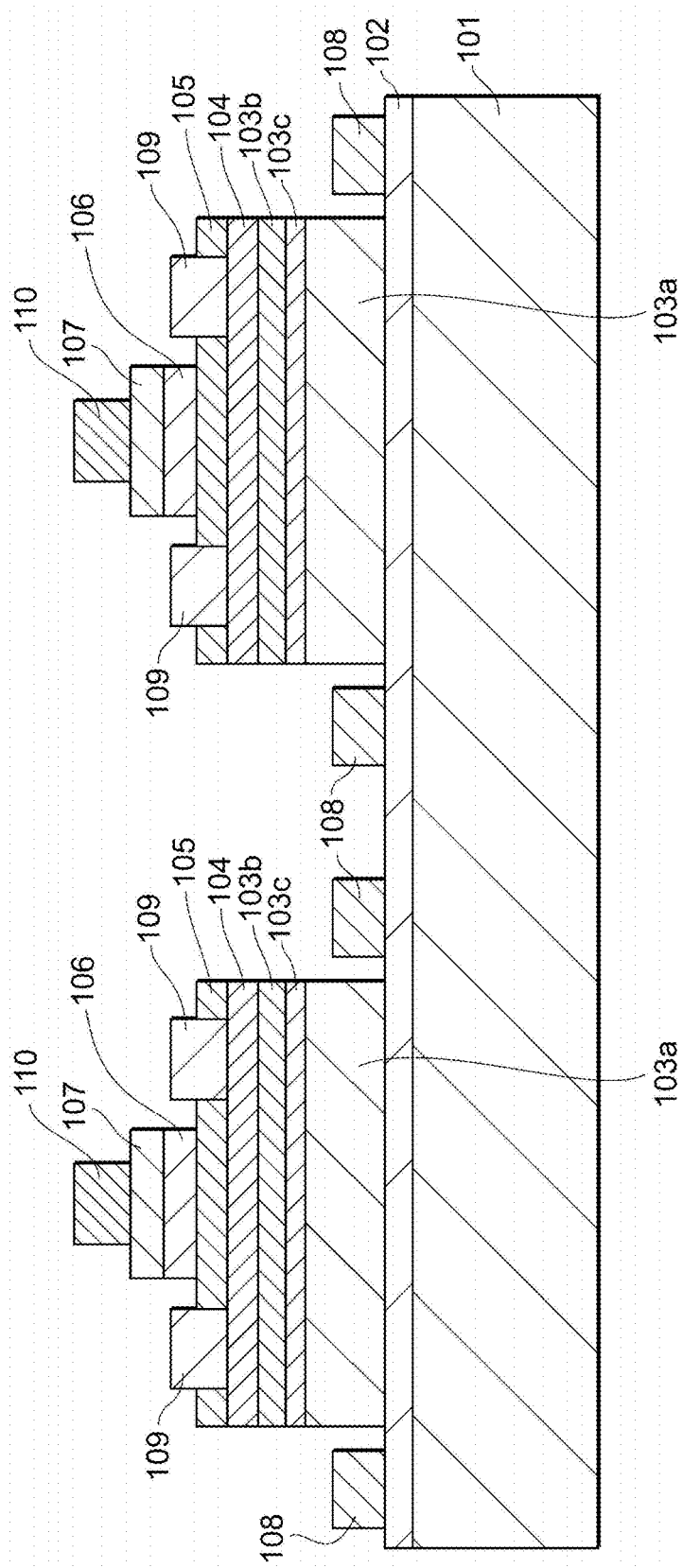
FIG. 9G is a diagram illustrating a procedure for the fabrication of HBTs 100C, HBTs according to a variation of Embodiment 1 of the present disclosure.

Then, as in FIG. 9G, collector electrodes 108 are formed, by the same method as the base electrodes for example, on the subcollector layer 102 in predetermined areas.

Figure 9H:
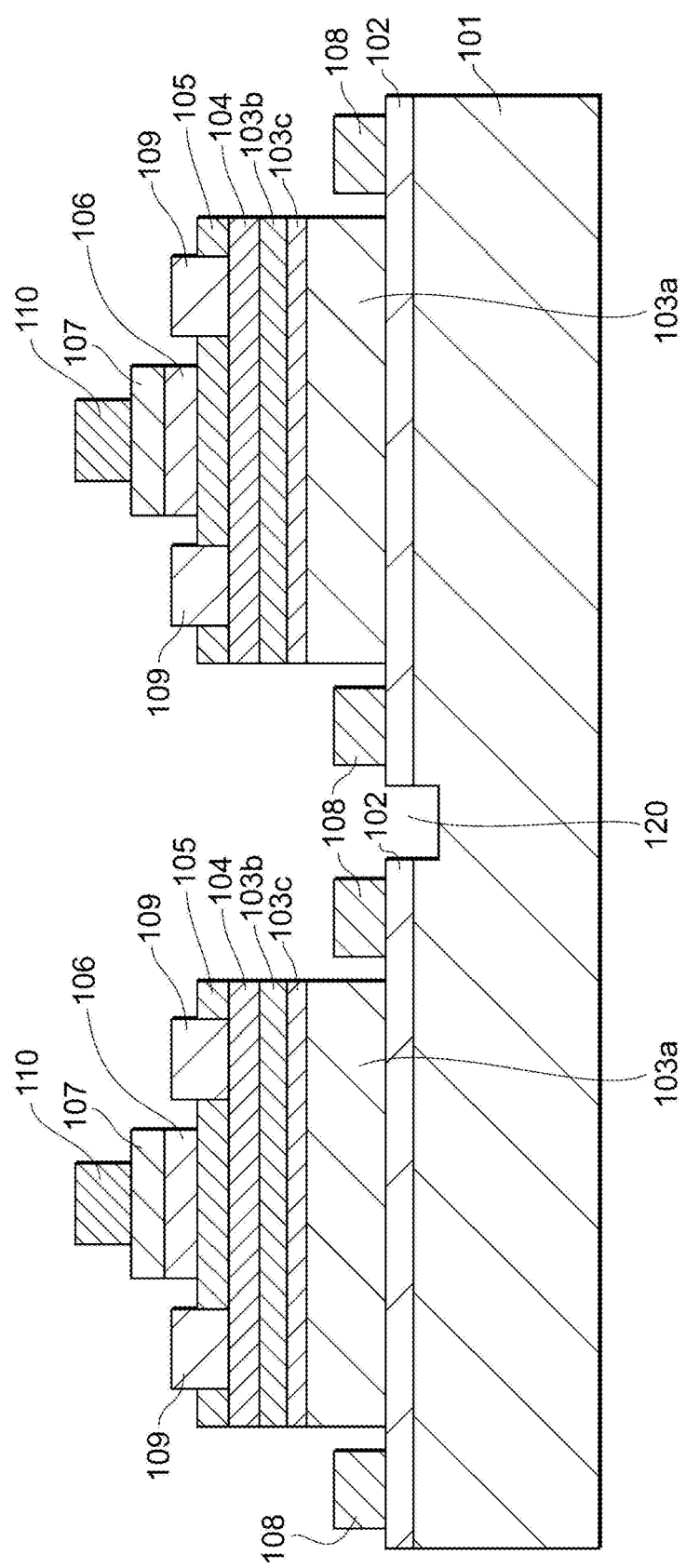
FIG. 9H is a diagram illustrating a procedure for the fabrication of HBTs 100C, HBTs according to a variation of Embodiment 1 of the present disclosure.

Then, as in FIG. 9H, an isolation trench 120 is formed, by photolithography and wet etching for example, to electrically isolate the two HBTs. The resulting isolation trench 120 extends, for example, through the subcollector layer 102 to the semiconductor substrate 101. When wet etching is used, the etchant can be, for example, an about 1:2:40 mixture of phosphoric acid, hydrogen peroxide, and water, and the etching process may be stopped at a particular time. It is also possible to use an isolation region formed by any other method, such as ion implantation, instead of the above isolation trench to electrically isolate the two HBTs.

Figure 9I:
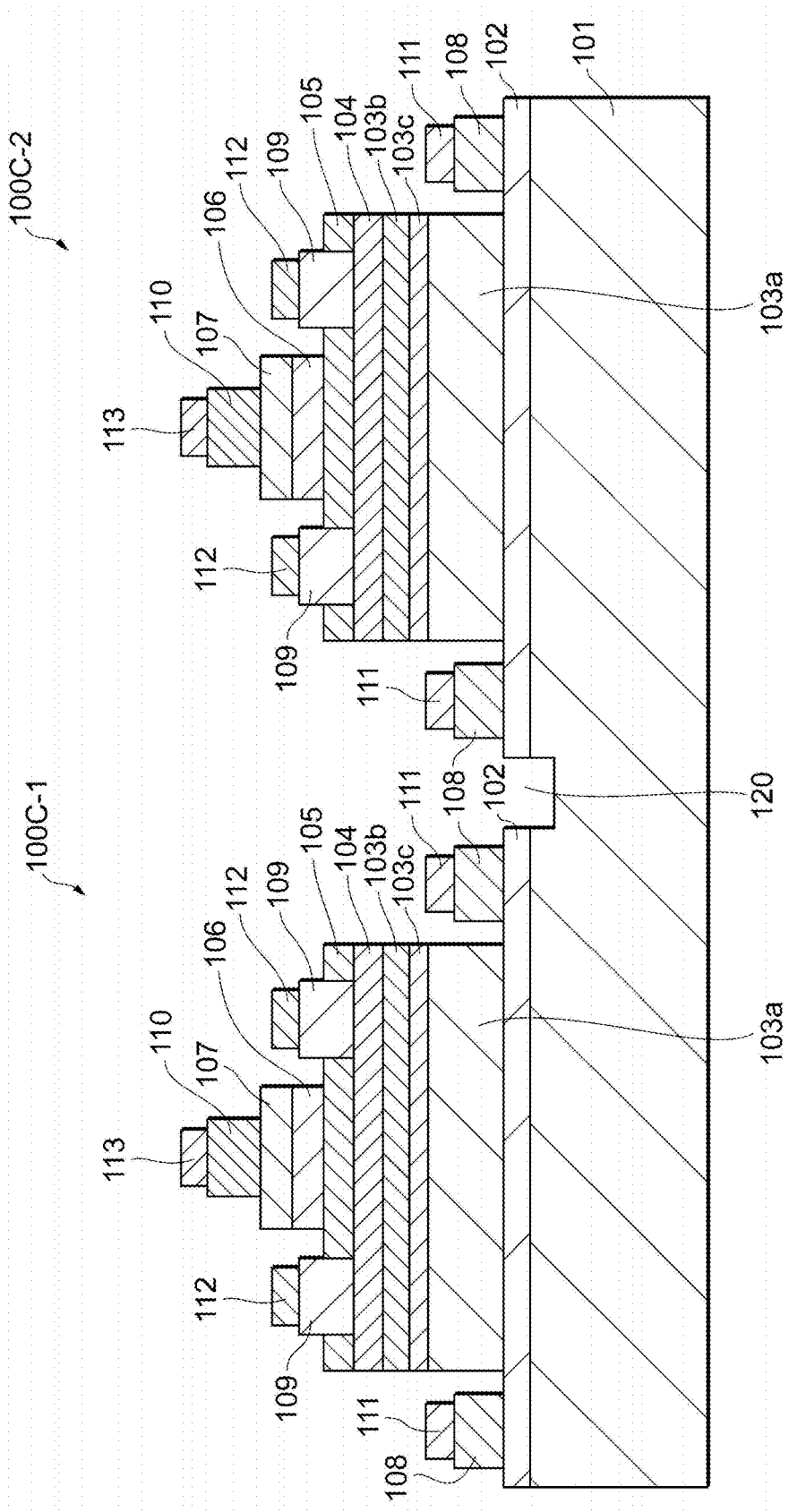
FIG. 9I is a diagram illustrating a procedure for the fabrication of HBTs 100C, HBTs according to a variation of Embodiment 1 of the present disclosure.

Lastly, as in FIG. 9I, collector wiring 111 is formed to couple the collector electrodes together, base wiring 112 to couple the base electrodes together, and emitter wiring 113 to couple the emitter electrodes together, by the same method as the base electrodes for example.

Figure 10:
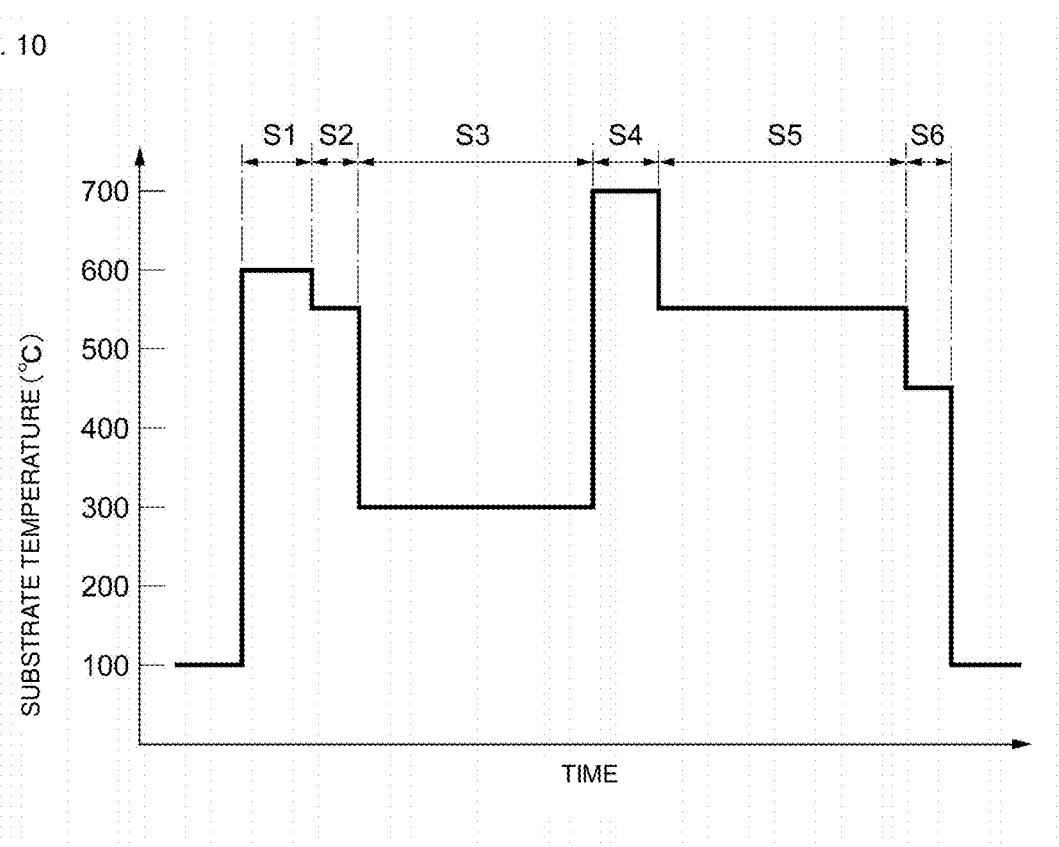
FIG. 10 is a graphical representation of substrate temperatures in the fabrication of an HBT 100C, an HBT according to a variation of Embodiment 1 of the present disclosure.

The following describes a temperature sequence that can be used in forming the multilayer film on the semiconductor substrate 101 by epitaxial growth (see FIG. 9A) with reference to FIG. 10. FIG. 10 is a graphical representation of substrate temperatures in the fabrication of an HBT 100C, an HBT according to a variation of Embodiment 1 of the present disclosure. In the graph in FIG. 10, the vertical and horizontal axes are for the set temperature (° C.) of the semiconductor substrate 101 and time, respectively. In this embodiment, the semiconductor substrate 101 is introduced into a gas-source MBE system, and its temperature is controlled by this system.

First, the semiconductor substrate 101 is heated to about 600° C. This thermally desorbs the oxides existing on the surface of the semiconductor substrate 101, leaving a clean surface (S1 in FIG. 10). The semiconductor substrate 101 is then cooled to about 550° C., and the subcollector layer 102 is formed (S2 in FIG. 10). The semiconductor substrate 101 is then cooled to about 300° C., and the first collector layer 103a is formed (S3 in FIG. 10). At this point in time, the first collector layer 103a is a low-temperature-grown undoped layer. The semiconductor substrate 101 is then heated to about 700° C. to anneal the first collector layer 103a formed in S3 (S4 in FIG. 10). As a result, particles of As are formed in the first collector layer 103a, providing a GaAs-based layer with As particles dispersed therein. The semiconductor substrate 101 is then cooled to about 550° C., and the barrier layer 103c, second collector layer 103b, base layer 104, emitter layer 105, and contact layer 106 are formed in this order (S5 in FIG. 10). The semiconductor substrate 101 is then cooled to about 450° C., and the contact layer 107 is formed (S6 in FIG. 10). Lastly, the semiconductor substrate 101 is cooled and removed from the gas-source MBE system.

Through this process, HBTs 100C can be fabricated. Note that the foregoing is not the only possible process for the fabrication of HBTs 100C.

Figure 11:
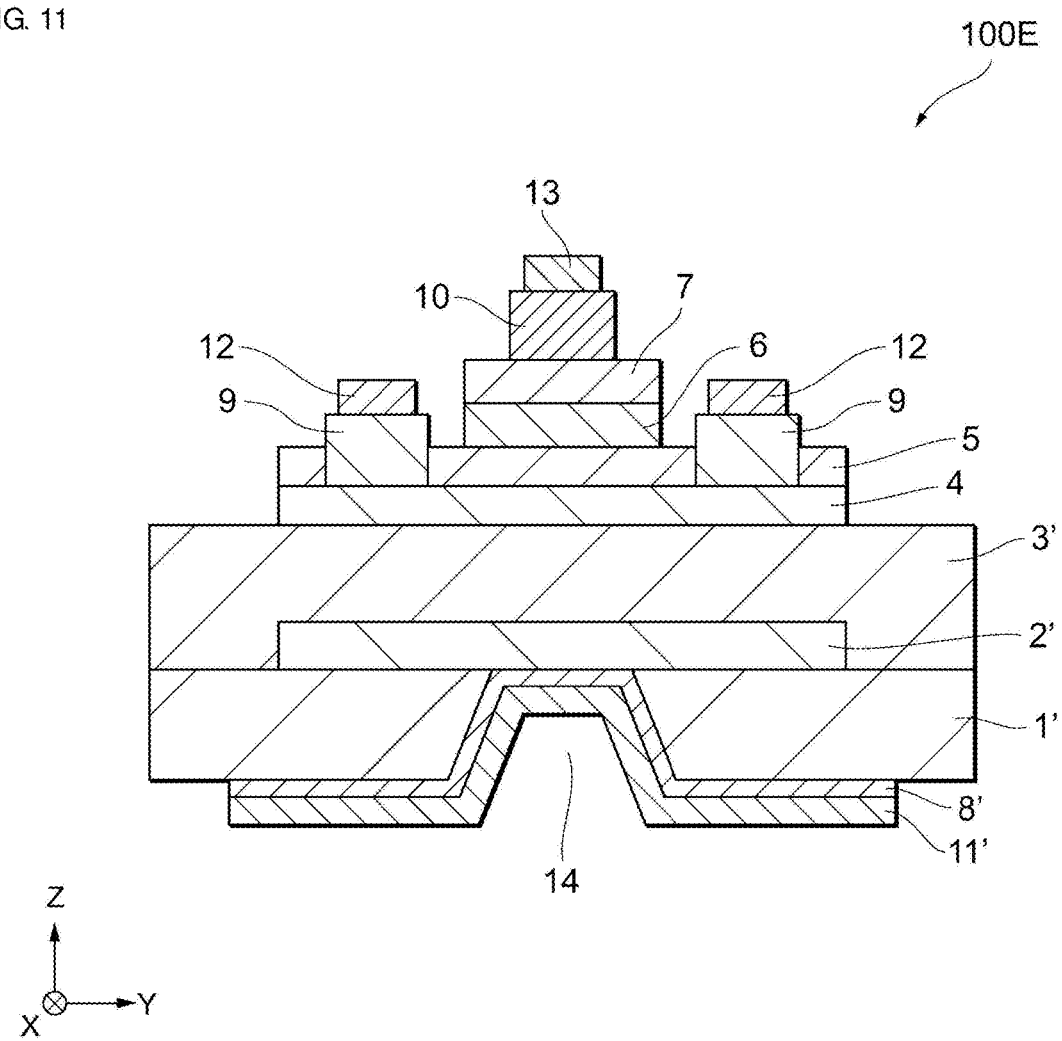
FIG. 11 is a cross-sectional view of an HBT 100E, an HBT according Embodiment 2 of the present disclosure.

The following describes an HBT 100E, an HBT according to Embodiment 2 of the present disclosure, with reference to FIG. 11. FIG. 11 is a cross-sectional view of an HBT 100E, an HBT according to Embodiment 2 of the present disclosure. The HBT 100E differs from the HBT 100A, illustrated in FIG. 1, in that the collector electrode and collector wiring are located on the second principal surface side (the negative side of the Z axis) of the semiconductor substrate. In the following description, the focus is on differences from the HBT 100A, and the components that the HBT 100A also has are not described.

There is a subcollector layer 2' between a semiconductor substrate 1' and a collector layer 3'. In the case of multiple HBTs arranged on the same semiconductor substrate, there may be multiple subcollector layers 2' corresponding one-to-one to the HBTs and spaced from each other (see FIG. 11). That is, the subcollector layer 2' is spaced from the subcollector layers of the HBTs contiguous to the HBT 100E.

The collector layer 3' covers the subcollector layer 2', spaced from the adjacent ones, on the semiconductor substrate 1'. The collector layer 3' may be shared by adjacent HBTs, and this gives any HBT contiguous to the HBT 100E the same structure as the HBT 100E. The rest of the structure of the collector layer 3' is the same as that of the collector layer 3 in FIG. 1 and is not described in detail.

In this embodiment, there are a collector electrode 8' and collector wiring 11' on the second principal surface side (the negative side of the Z axis) of the semiconductor substrate 1'. The semiconductor substrate 1' has a via hole 14 (through-hole portion) created therethrough between its first and second principal surfaces (see FIG. 11). The subcollector layer 2', interposed between the semiconductor substrate 1' and the collector layer 3', is partially exposed in the region under which the via hole 14 exists. The collector electrode 8' and the collector wiring 11' are conformal to the shape of the semiconductor substrate 1' and reach the inside of the via hole 14, which extends through the semiconductor substrate 1'. As a result, the collector electrode 8' is in contact with the exposed portion of the subcollector layer 2' within the via hole 14. The collector layer 3' can therefore be electrically coupled to the outside of the HBT 100E via the subcollector layer 2', collector electrode 8', and collector wiring 11'.

In such a structure, the HBT 100E still has the same advantages as the HBT 100A. Furthermore, the HBT 100E has a collector electrode 8' on the second principal surface side of the semiconductor substrate 1'. When an array of multiple HBTs is fabricated, this eliminates the need for space on both sides of each subcollector layer for the formation of collector electrodes. The chip size is therefore smaller, and the chip cost is lower, than would be with the HBTs 100A to 100D. Each HBT 100E has its own, isolated subcollector layer 2', and its collector layer 3' has a relatively high resistance because of complete depletion. These features also make the chip size smaller and the chip cost lower than would be with the HBTs 100A to 100D, by eliminating the need for space between adjacent HBTs for the formation of an isolation trench (see FIG. 9I).

Figure 12:
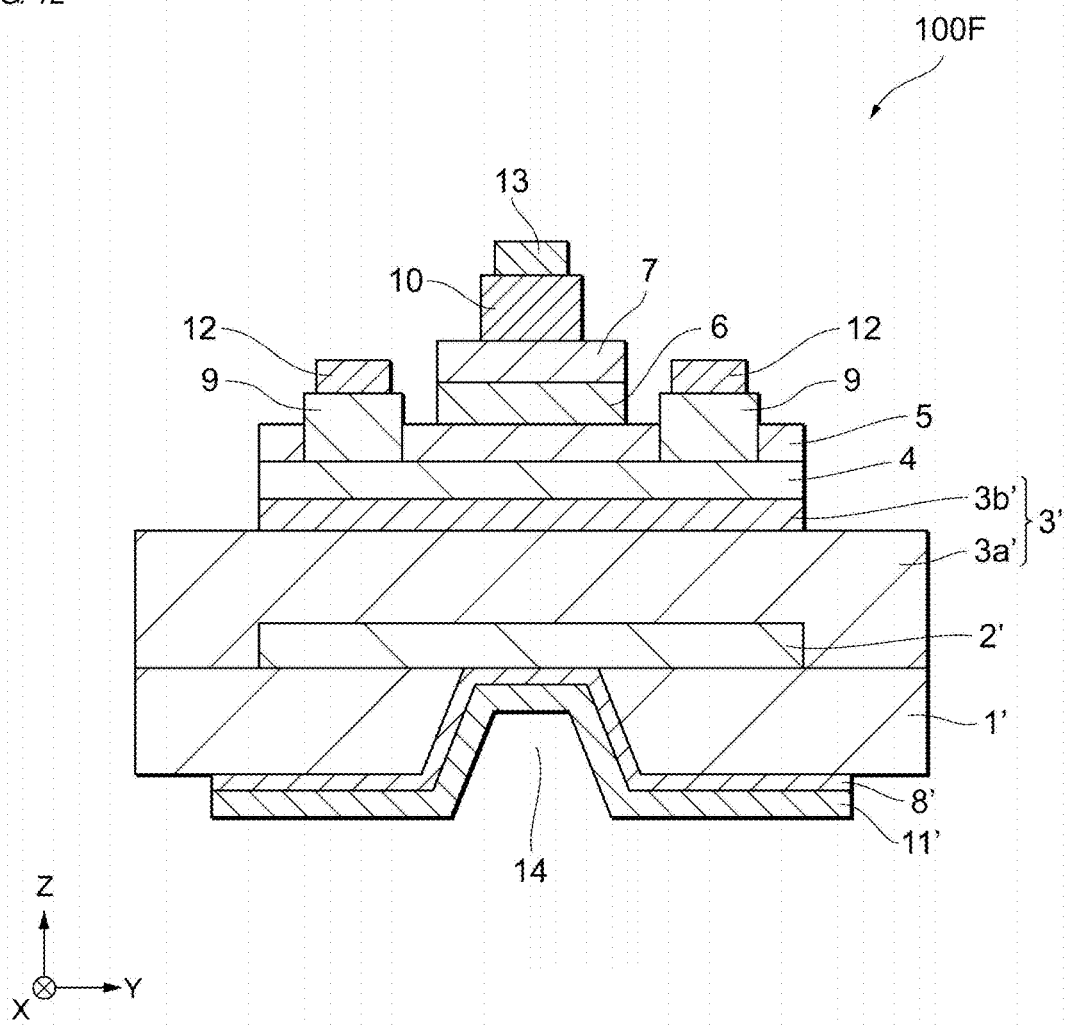
FIG. 12 is a cross-sectional view of an HBT 100F, an HBT according to a variation of Embodiment 2 of the present disclosure.

FIG. 12 is a cross-sectional view of an HBT 100F, an HBT according to a variation of Embodiment 2 of the present disclosure. Compared with the HBT 100E, illustrated in FIG. 11, the HBT 100F has a first collector layer 3a' and a second collector layer 3b' in the collector layer 3'. The first collector layer 3a' and the second collector layer 3b' are the same as the collector layer 3' in FIG. 11 and the second collector layer 3b in FIG. 6, respectively, and are not described in detail.

In such a structure, the HBT 100F still has the same advantages as the HBT 100E. Furthermore, the second collector layer 3b' of the HBT 100F limits the Kirk effect, providing control over the related degradation of high-frequency characteristics.

Figure 13:
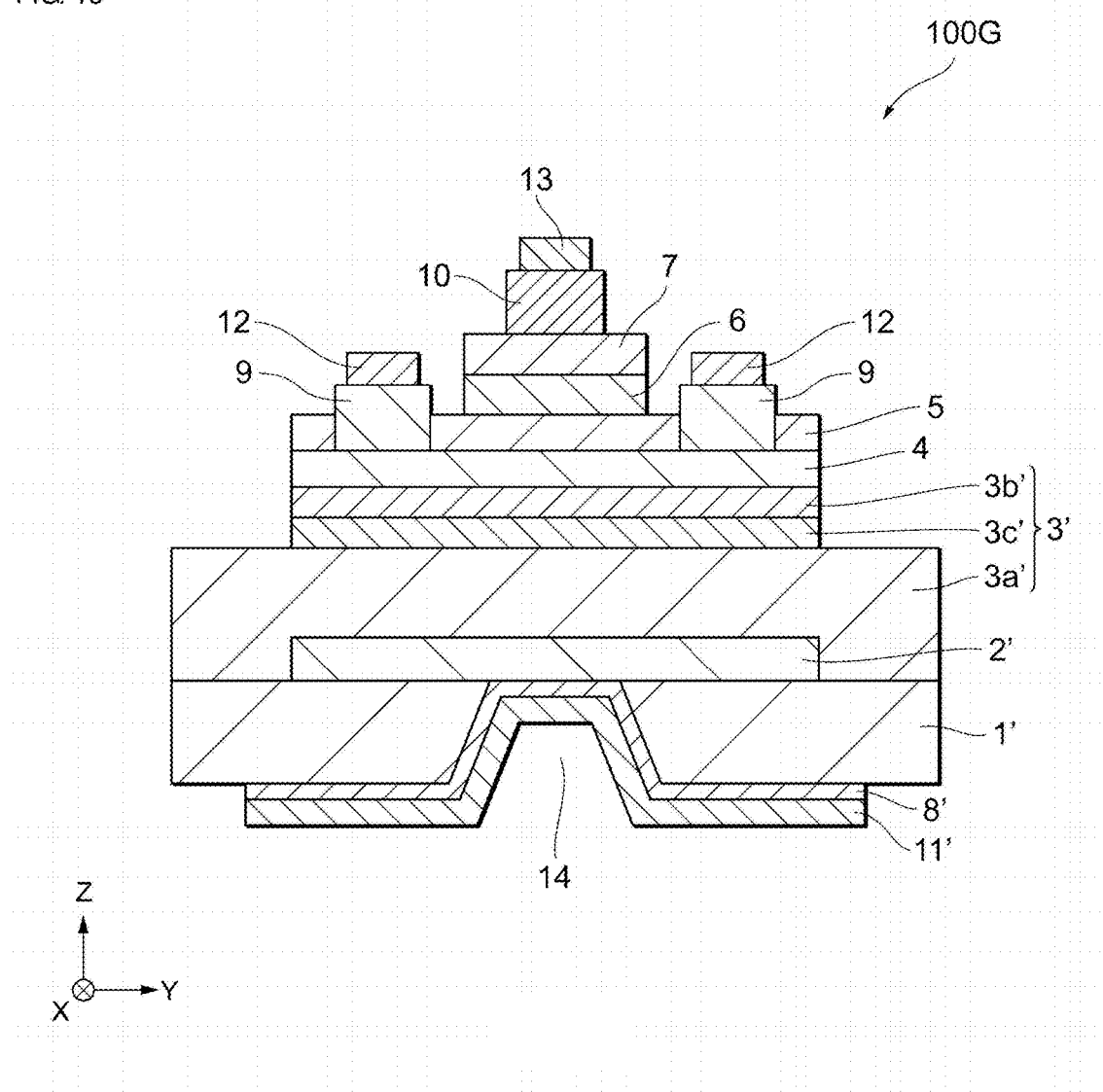
FIG. 13 is a cross-sectional view of an HBT 100G, an HBT according to another variation of Embodiment 2 of the present disclosure.

FIG. 13 is a cross-sectional view of an HBT 100G, an HBT according to another variation of Embodiment 2 of the present disclosure. Compared with the HBT 100F, illustrated in FIG. 12, the HBT 100G has a barrier layer 3c' between the first collector layer 3a' and second collector layer 3b' in the collector layer 3'. The barrier layer 3c' is the same as the barrier layer 3c in FIG. 7 and is not described in detail.

In such a structure, the HBT 100G still has the same advantages as the HBT 100F. Furthermore, the HBT 100G is improved compared with the HBTs 100E and 100F in terms of loss of current gain and reliability. The barrier layer 3c' may be on the second collector layer 3b' (on the positive side of the Z axis), and the second collector layer 3b' is optional for this HBT 100G.

The following describes the fabrication of HBTs 100G, HBTs according to a variation of Embodiment 2 of the present disclosure, with reference to FIGS. 14A to 14L. FIGS. 14A to 14L are diagrams illustrating a procedure for the fabrication of HBTs 100G, HBTs according to a variation of Embodiment 2 of the present disclosure. The diagrams of FIGS. 14A to 14L, having the same orientation as the cross-sectional view of an HBT 100G in FIG. 13, illustrate an example case in which two adjacent HBTs 100G (an HBT 100G-1 and an HBT 100G-2) are fabricated. The materials for the individual components are as in the above description and are not described in detail. For brevity, any component of the HBTs 100G corresponding to that of HBTs 100C is represented by the same numeral as in the description of the fabrication of HBTs 100C illustrated in FIGS. 9A to 9I.

Figure 14A:
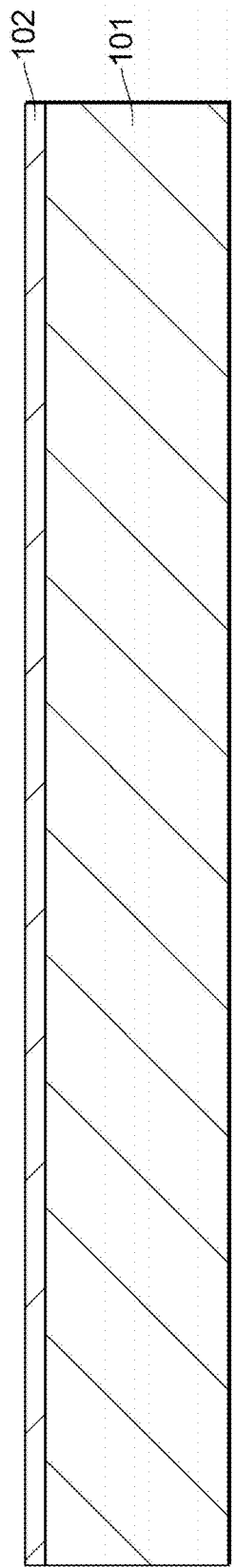
FIG. 14A is a diagram illustrating a procedure for the fabrication of HBTs 100G, HBTs according to a variation of Embodiment 2 of the present disclosure.

First, as in FIG. 14A, a subcollector layer 102 is formed, by gas-source molecular beam epitaxy (gas-source MBE) for example, on a semiconductor substrate 101.

Figure 14B:
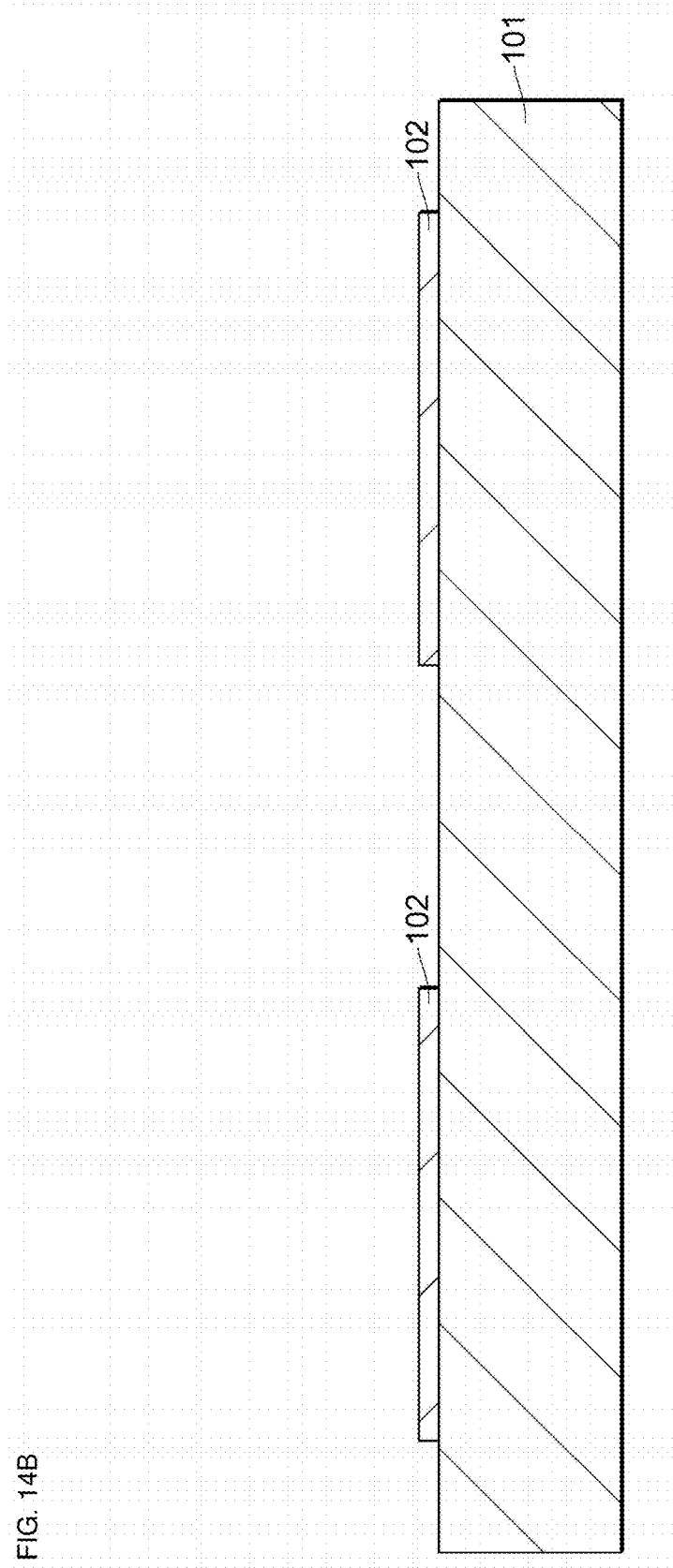
FIG. 14B is a diagram illustrating a procedure for the fabrication of HBTs 100G, HBTs according to a variation of Embodiment 2 of the present disclosure.

Then, as in FIG. 14B, the subcollector layer 102 is removed, by photolithography (the photoresist not illustrated) and wet etching for example, in predetermined areas to expose the surface of the semiconductor substrate 101. The wet etchant can be an about 1:2:40 mixture of phosphoric acid, hydrogen peroxide, and water.

Figure 14C:
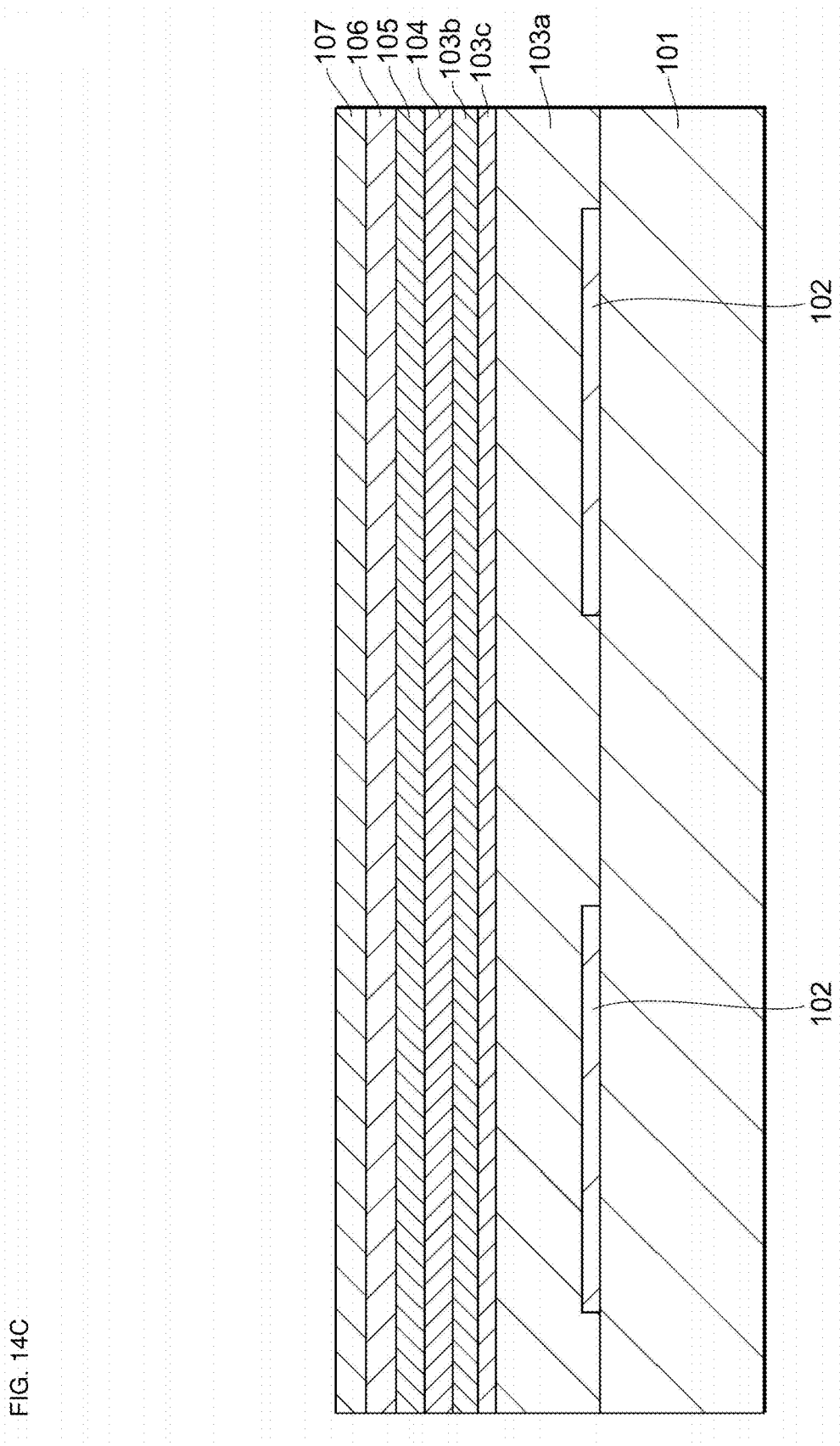
FIG. 14C is a diagram illustrating a procedure for the fabrication of HBTs 100G, HBTs according to a variation of Embodiment 2 of the present disclosure.
Figure 14D:
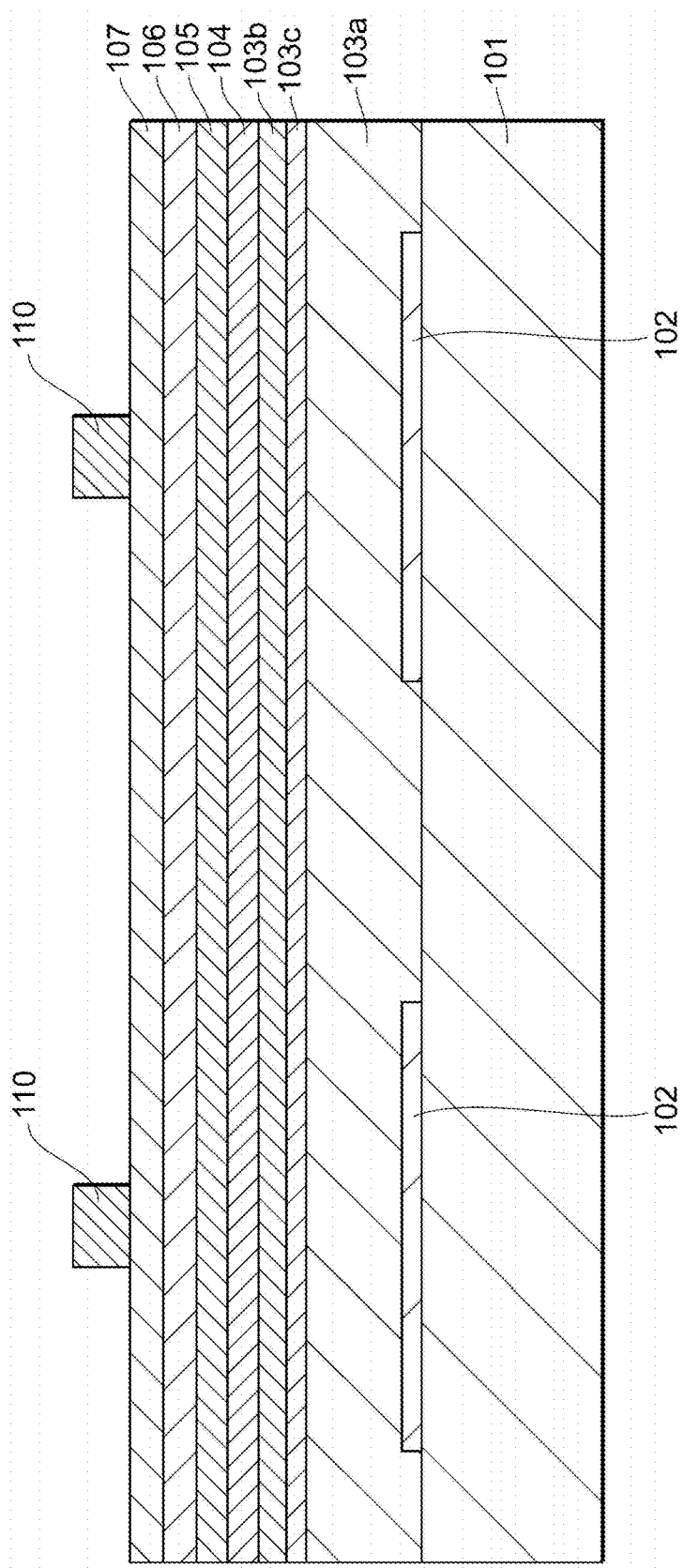
FIG. 14D is a diagram illustrating a procedure for the fabrication of HBTs 100G, HBTs according to a variation of Embodiment 2 of the present disclosure.
Figure 14E:
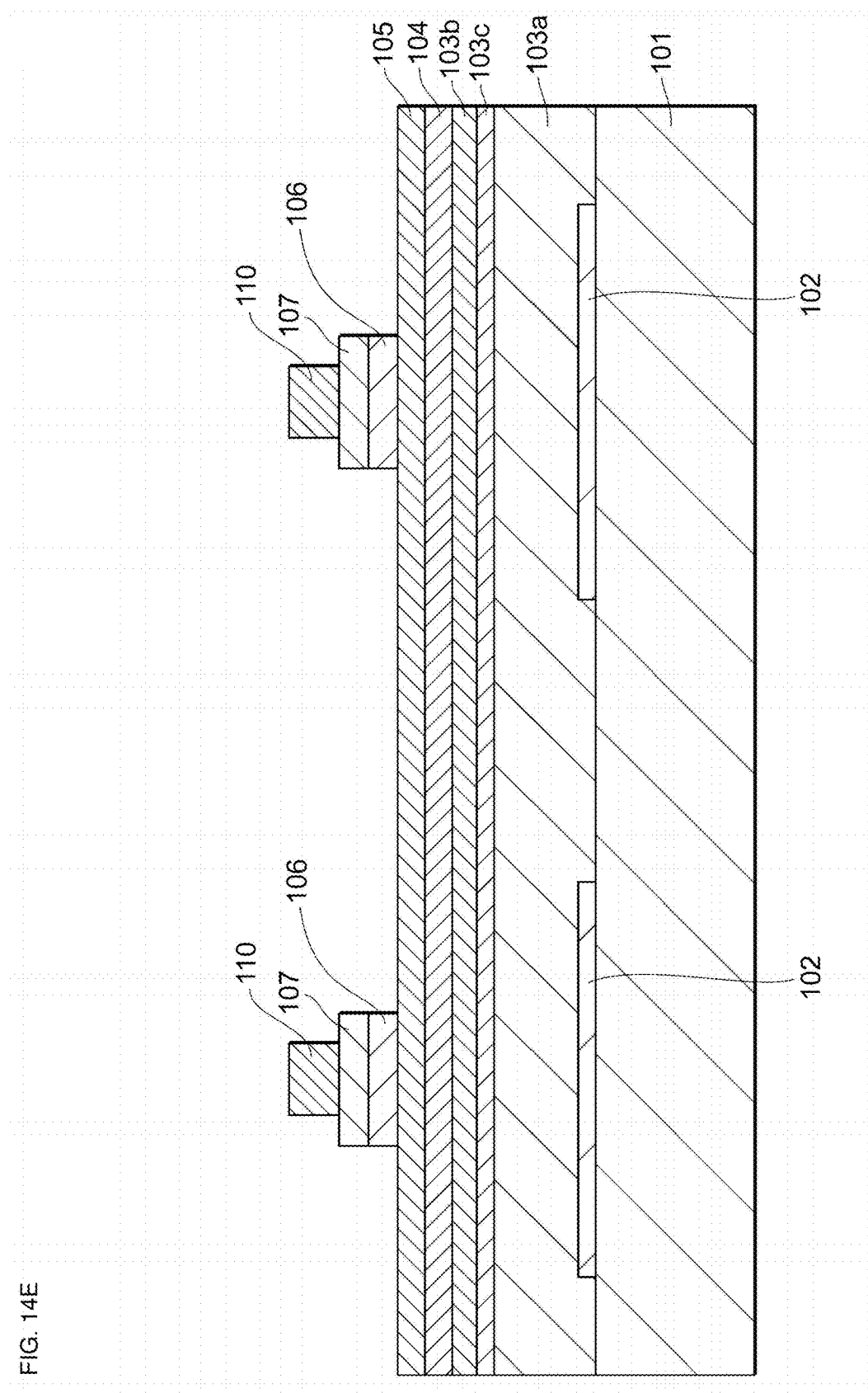
FIG. 14E is a diagram illustrating a procedure for the fabrication of HBTs 100G, HBTs according to a variation of Embodiment 2 of the present disclosure.
Figure 14F:
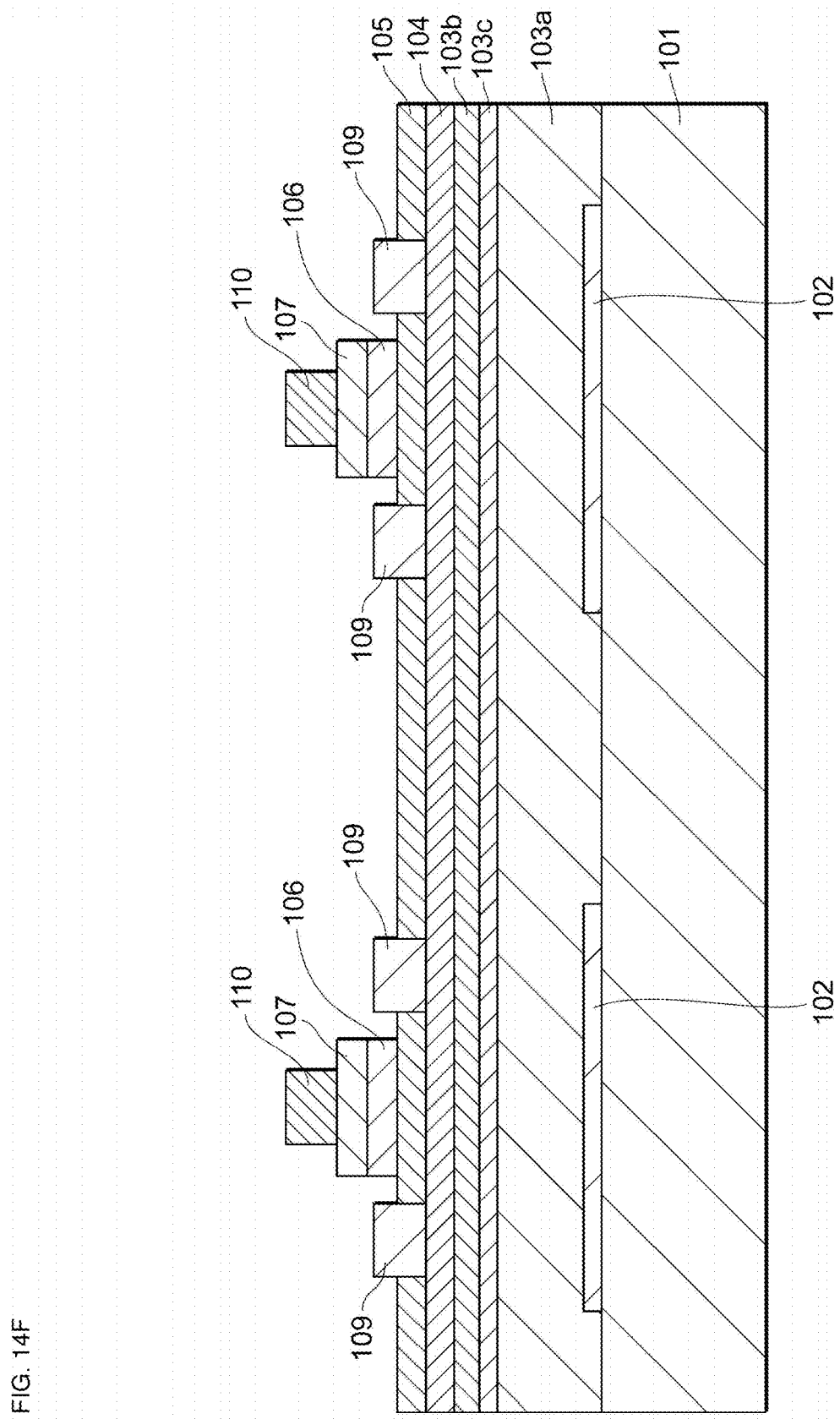
FIG. 14F is a diagram illustrating a procedure for the fabrication of HBTs 100G, HBTs according to a variation of Embodiment 2 of the present disclosure.
Figure 14G:
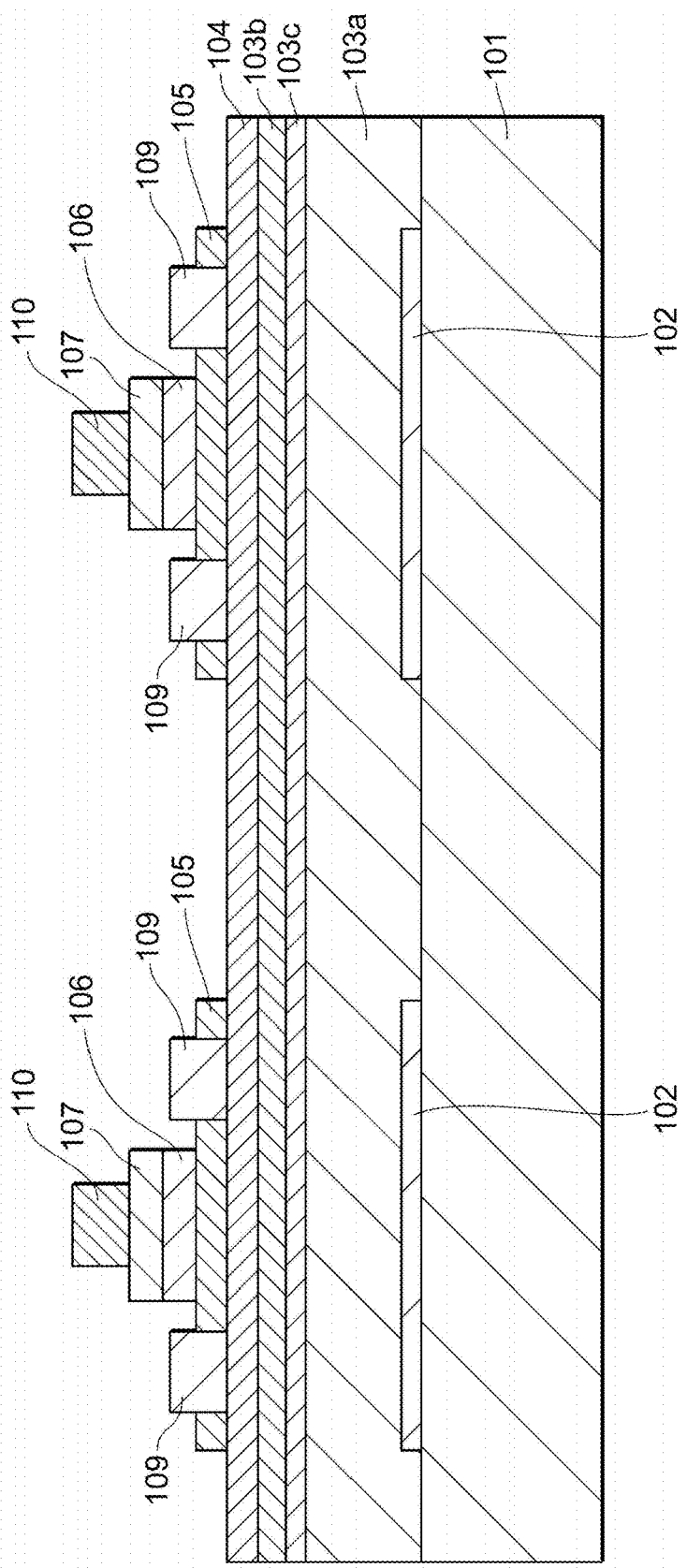
FIG. 14G is a diagram illustrating a procedure for the fabrication of HBTs 100G, HBTs according to a variation of Embodiment 2 of the present disclosure.

Then, as in FIG. 14C, atop the semiconductor substrate 101 are formed a first collector layer 103a, a barrier layer 103c, a second collector layer 103b, a base layer 104, an emitter layer 105, and contact layers 106 and 107 in this order, by gas-source molecular beam epitaxy (gas-source MBE) for example, to give a multilayer structure.

Then, as in FIGS. 14D to 14G, emitter electrodes 110 and base electrodes 109 are formed, and unnecessary portions of the emitter layer 105 are removed. The procedure for these is the same as that in the fabrication of HBTs 100C, illustrated in FIGS. 9B to 9E, and is not described in detail.

Figure 14H:
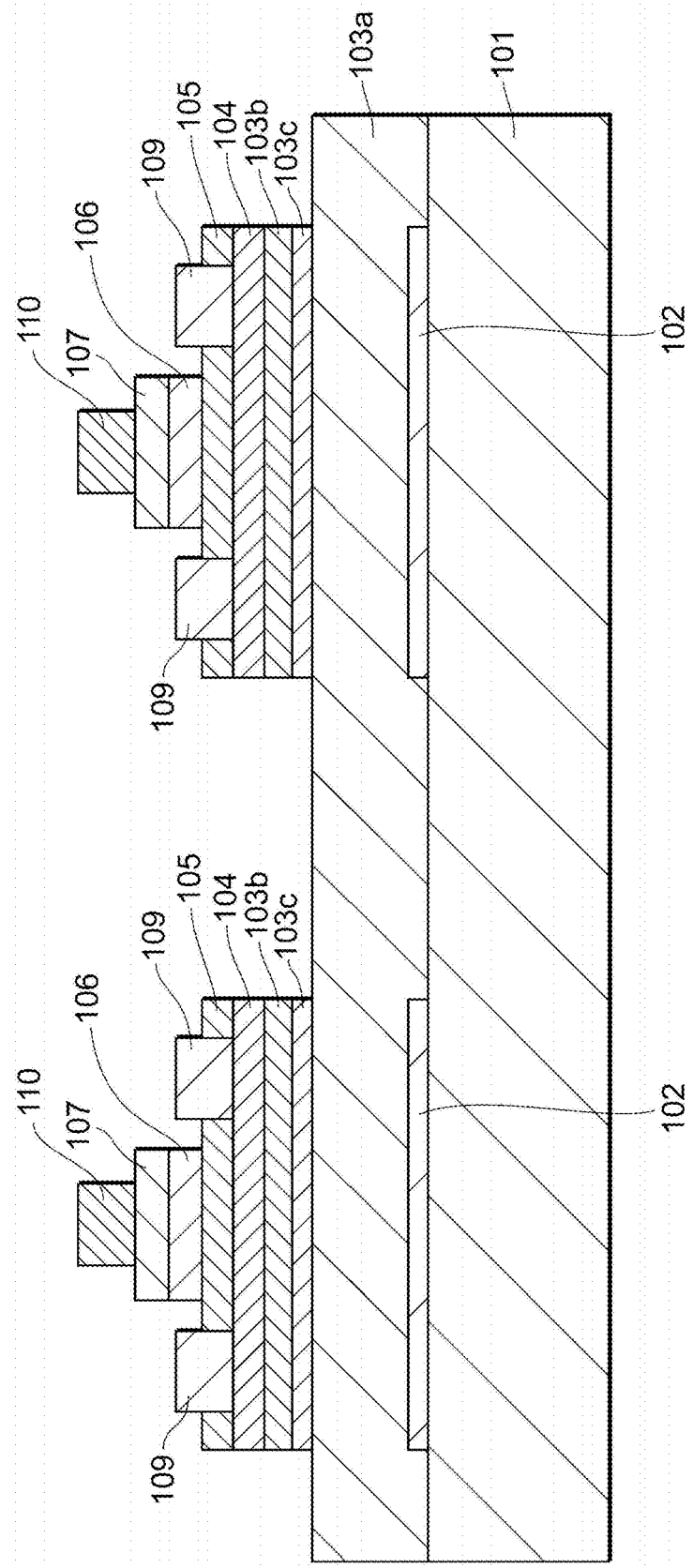
FIG. 14H is a diagram illustrating a procedure for the fabrication of HBTs 100G, HBTs according to a variation of Embodiment 2 of the present disclosure.

Then, as in FIG. 14H, the base layer 104, second collector layer 103b, and barrier layer 103c are removed, by wet etching for example, to expose the surface of the first collector layer 103a. The photoresist in FIG. 14G serves as a mask. When wet etching is used, the etchant can be, for example, an about 1:2:40 mixture of phosphoric acid, hydrogen peroxide, and water, and the etching process may be stopped at a particular time.

Figure 14I:
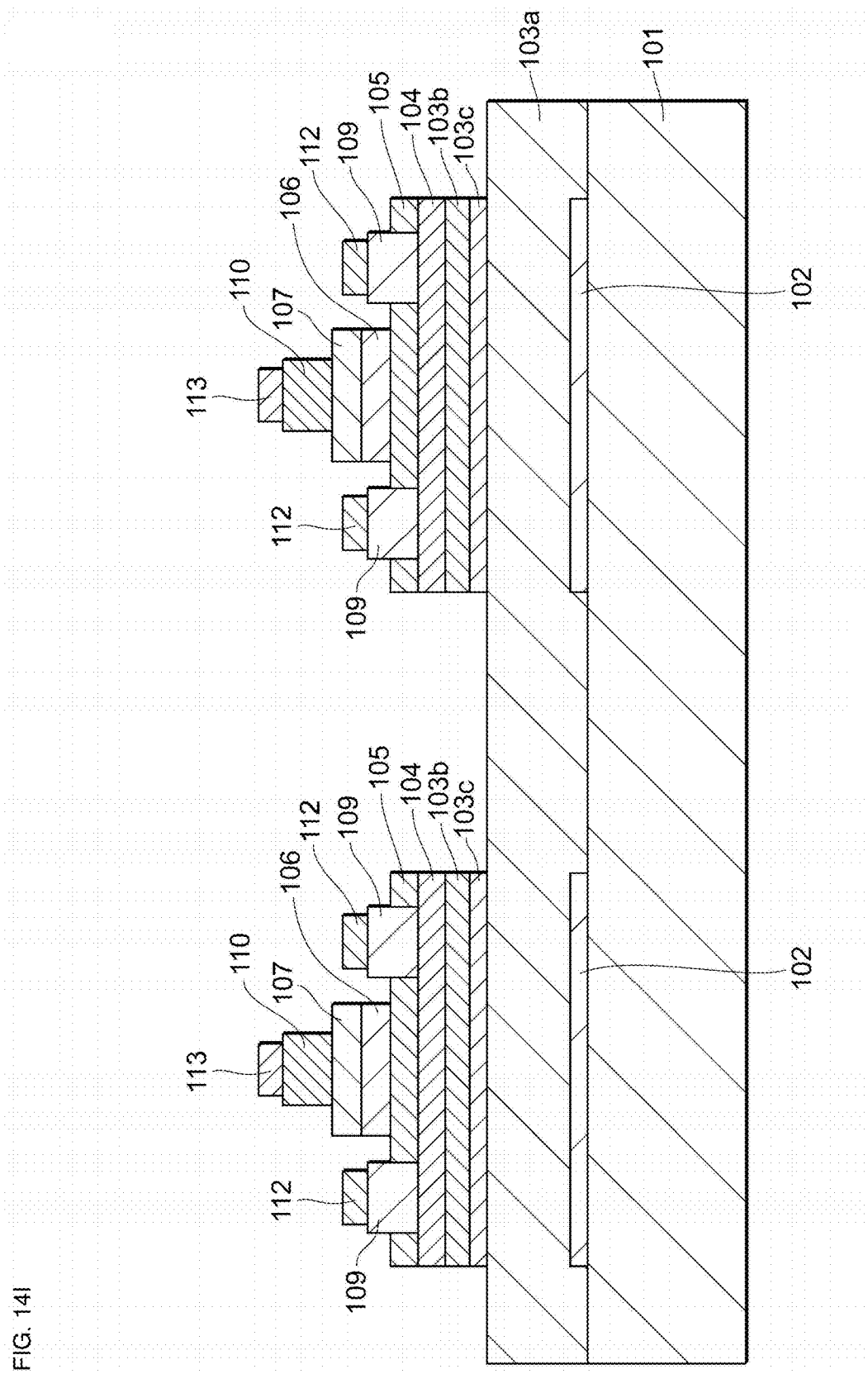
FIG. 14I is a diagram illustrating a procedure for the fabrication of HBTs 100G, HBTs according to a variation of Embodiment 2 of the present disclosure.

Then, as in FIG. 14I, base wiring 112 is formed to couple the base electrodes together, and emitter wiring 113 to couple the emitter electrodes together, by the same method as the base electrodes for example.

Figure 14J:
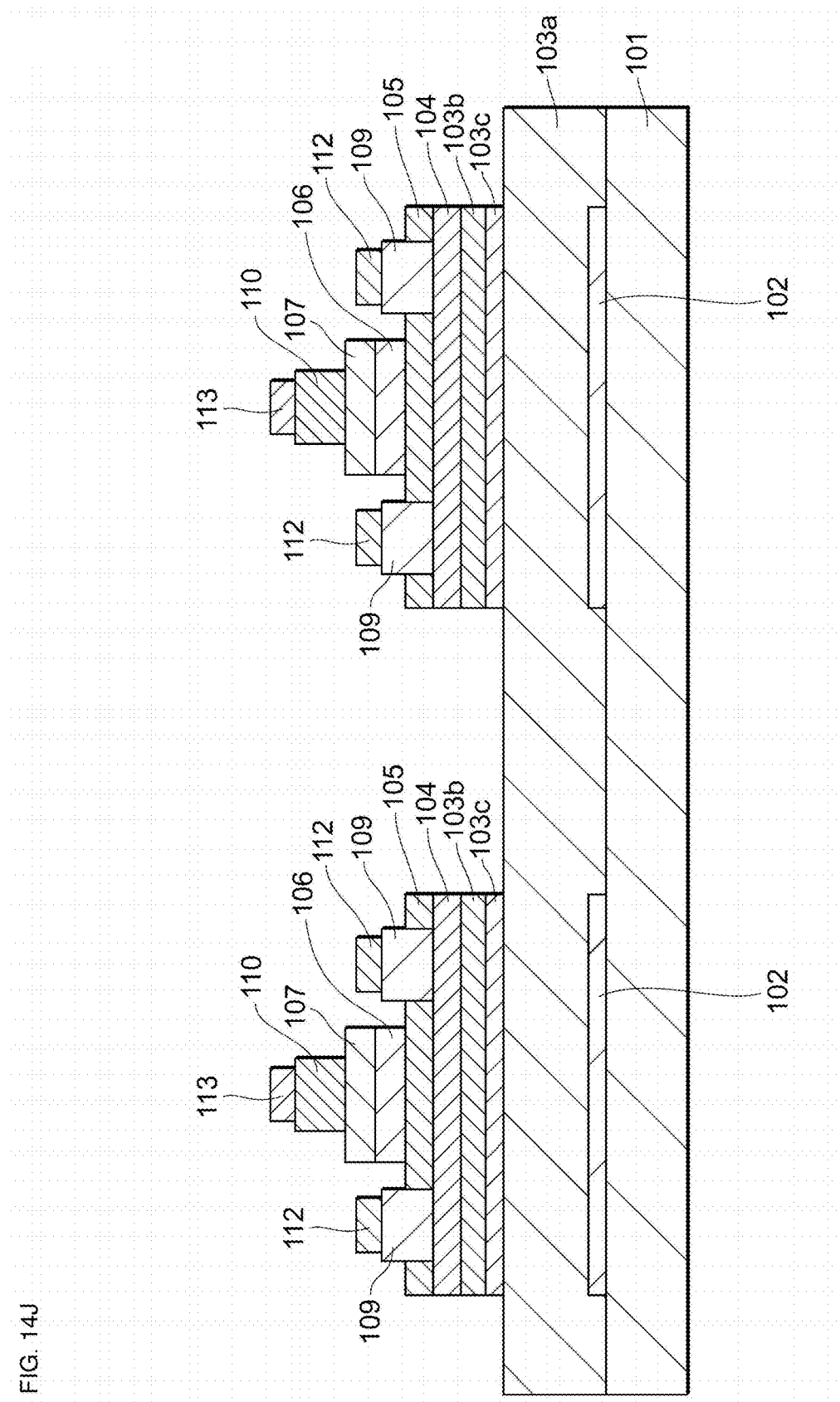
FIG. 14J is a diagram illustrating a procedure for the fabrication of HBTs 100G, HBTs according to a variation of Embodiment 2 of the present disclosure.

Then, as in FIG. 14J, the semiconductor substrate 101 is ground into a thin layer, starting on its second principal surface (the principal surface on the negative side of the Z axis). The resulting thickness of the semiconductor substrate 101 is, for example, about 50 µm.

Figure 14K:
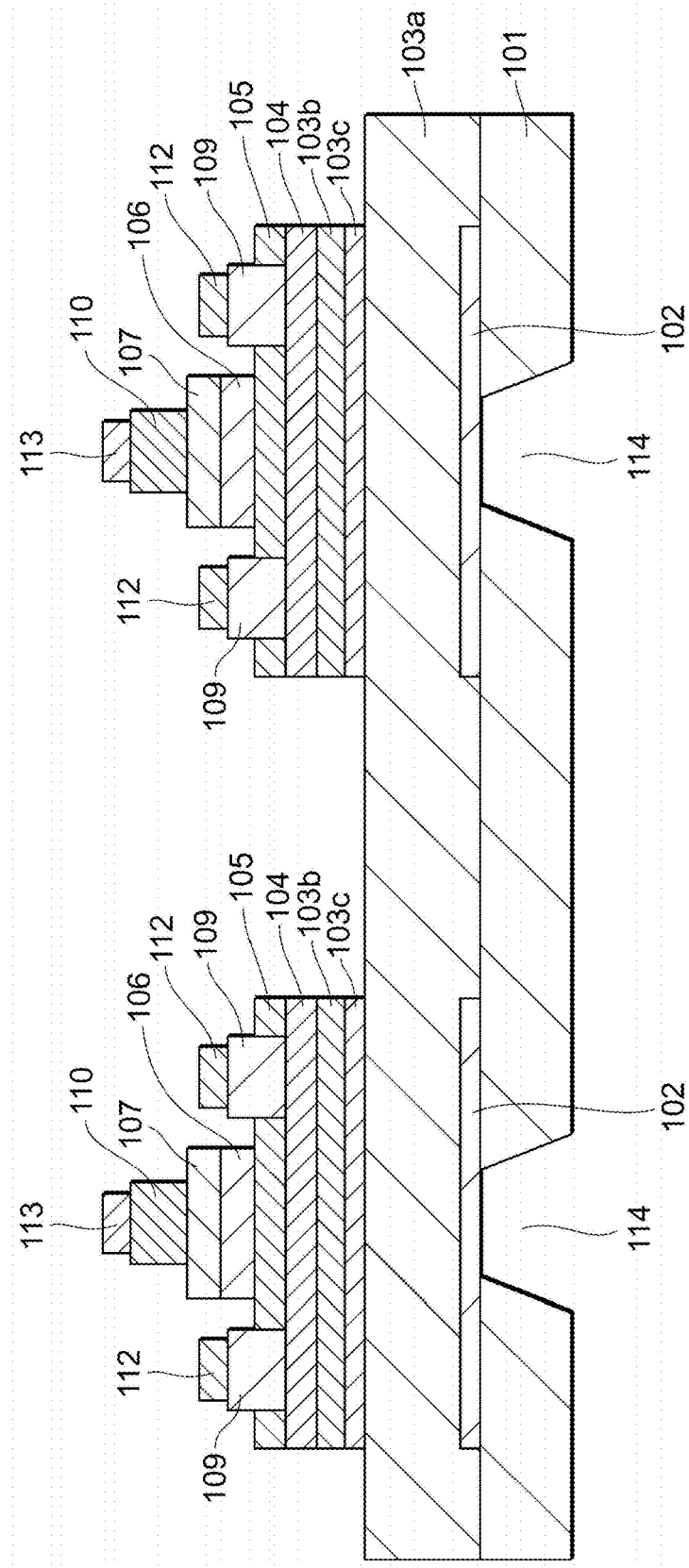
FIG. 14K is a diagram illustrating a procedure for the fabrication of HBTs 100G, HBTs according to a variation of Embodiment 2 of the present disclosure.

Then, as in FIG. 14K, via holes 114 are created, by photolithography (the photoresist not illustrated) and dry etching for example, between the second principal surface of the semiconductor substrate 101 and the subcollector layer 102.

Figure 14L:
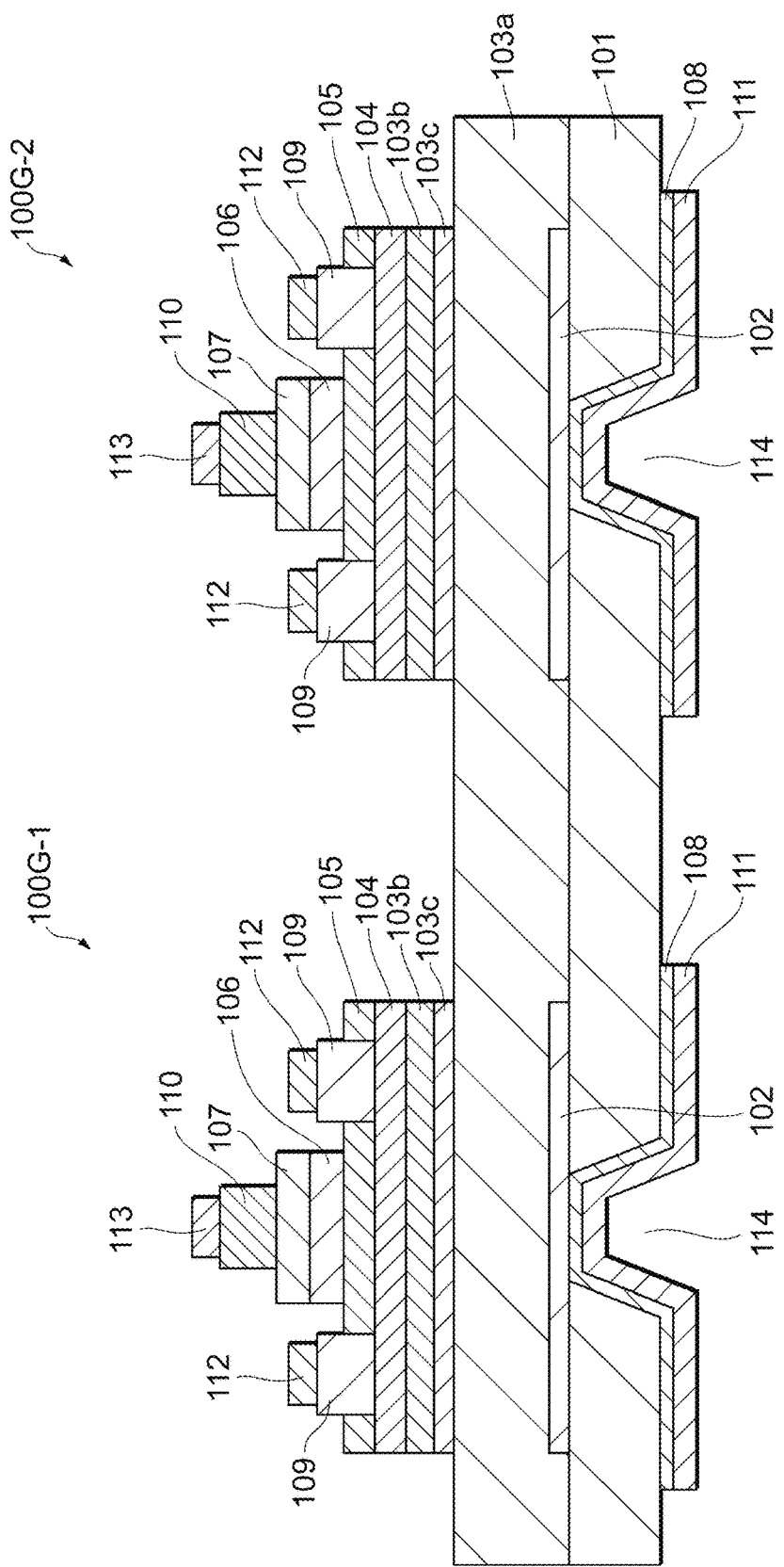
FIG. 14L is a diagram illustrating a procedure for the fabrication of HBTs 100G, HBTs according to a variation of Embodiment 2 of the present disclosure.

Lastly, as in FIG. 14L, collector electrodes 108 are formed to reach the inside of the via holes 114, and then collector wiring 111 thereon (on the negative side of the Z axis) to couple the collector electrodes together, by the same method as the base electrodes for example.

Through this process, HBTs 100G can be fabricated. Note that the foregoing is not the only possible process for the fabrication of HBTs 100G.

Some illustrative embodiments of the present disclosure have been described above. The HBTs 100A to 100G include a semiconductor substrate 1 or 1' and a collector layer 3 or 3', a base layer 4, and an emitter layer 5 stacked in this order thereon. The collector layer 3 or 3' contains metal particles dispersed therein, and the metal particles are each formed by multiple metal atoms bonded with each other. As a result, the collector layer 3 or 3' has a wide depletion region whatever the collector voltage is, without the use of a complicated doping profile. These HBTs therefore combine a low collector-voltage dependence of base-collector capacitance with stable control of their fabrication in mass production.

The HBTs 100B to 100D, 100F, and 100G further include a GaAs-based second collector layer 3b or 3b' between the first collector layer 3a or 3a' and the base layer 4. The second collector layer 3b or 3b' limits the Kirk effect, providing control over the related degradation of high-frequency characteristics.

The HBTs 100C, 100D, and 100G further include an AlGaAs-based barrier layer 3c or 3c' between the first collector layer 3a or 3a' and the base layer 4. The barrier layer 3c or 3c' prevents any point defect potentially contained in the first collector layer 3a or 3a' from diffusing to the base layer 4, limiting the related loss of the current gain and/or reliability of the HBT.

The HBTs 100E to 100G have a collector electrode 8' on the second principal surface side of the semiconductor substrate 1'. When an array of multiple HBTs is fabricated, this eliminates the need for space on both sides of each subcollector layer for the formation of collector electrodes. The chip size is therefore smaller, and the chip cost is lower, than would be with the HBTs 100A to 100D.

Furthermore, each HBT 100E to 100G has a subcollector layer 2' spaced from those of adjacent HBTs, and its collector layer 3' is shared by adjacent HBTs. These features make the chip size smaller and the chip cost lower than would be with the HBTs 100A to 100D, by eliminating the need for space between adjacent HBTs for the formation of an isolation trench.

The HBTs 100E to 100G also have a via hole 14 through their semiconductor substrate 1', and the collector electrode 8' reaches the inside of the via hole 14 to be in contact with the subcollector layer 2', although this is not the only possible structure of the semiconductor substrate 1' and collector electrode 8'.

The metal particles contained in the first collector layer 3a or 3a' can be particles of any metal. For example, they can be As-based particles.

Each semiconductor layer can be made of any material. For example, the first collector layer 3a or 3a' can be a GaAs-based layer, the emitter layer 5 can be an InGaP- or AlGaAs-based layer, the base layer 4 can be a GaAs-, InGaAs-, or GaAsSb-based layer, and the semiconductor substrate 1 or 1' can be a GaAs-based substrate.

While preferred embodiments of the disclosure have been described above, it is to be understood that variations and modifications will be apparent to those skilled in the art without departing from the scope and spirit of the disclosure.

The scope of the disclosure, therefore, is to be determined solely by the following claims.

What is claimed is:

1. A heterojunction bipolar transistor comprising:
   a semiconductor substrate having first and second principal surfaces opposite each other; and
   a collector layer, a base layer, and an emitter layer stacked in this order on a first principal surface side of the semiconductor substrate, wherein
      the collector layer includes a first semiconductor layer with metalloid particles dispersed therein, the metalloid particles each formed by a plurality of metalloid atoms bonded with each other.

2. The heterojunction bipolar transistor according to claim 1, wherein:
   the collector layer further includes a second semiconductor layer between the first semiconductor layer and the base layer; and
   the second semiconductor layer is a GaAs-based layer.

3. The heterojunction bipolar transistor according to claim 1, wherein:
   the collector layer further includes a third semiconductor layer between the first semiconductor layer and the base layer; and
   the third semiconductor layer is an AlGaAs-based layer.

4. The heterojunction bipolar transistor according to claim 1, further comprising a collector electrode on a second principal surface side of the semiconductor substrate.

5. The heterojunction bipolar transistor according to claim 4, further comprising a subcollector layer between the semiconductor substrate and the collector layer, wherein:
   the heterojunction bipolar transistor is a first heterojunction bipolar transistor;
   the subcollector layer is spaced from a subcollector layer of a second heterojunction bipolar transistor contiguous to the first heterojunction bipolar transistor; and
   the second heterojunction bipolar transistor includes a base layer and an emitter layer stacked in this order on the collector layer on the first principal surface side of the semiconductor substrate.

6. The heterojunction bipolar transistor according to claim 5, wherein:
   the semiconductor substrate further includes a through-hole portion extending therethrough between the first and second principal surfaces; and
   the collector electrode reaches an inside of the through-hole portion of the semiconductor substrate to be in contact with the subcollector layer of the heterojunction bipolar transistor.

7. A heterojunction bipolar transistor comprising:
   a semiconductor substrate having first and second principal surfaces opposite each other; and
   a collector layer, a base layer, and an emitter layer stacked in this order on a first principal surface side of the semiconductor substrate, wherein
      the collector layer includes a first semiconductor layer with metalloid particles dispersed therein, a GaAs-based second semiconductor layer, and an AlGaAs-based third semiconductor layer; and
   the third semiconductor layer is between the first semiconductor layer and the second semiconductor layer.

8. The heterojunction bipolar transistor according to claim 7, wherein:
   the third semiconductor layer is a superlattice of AlGaAs layers and GaAs layers.

9. The heterojunction bipolar transistor according to claim 8, further comprising a collector electrode on a second principal surface side of the semiconductor substrate.

10. The heterojunction bipolar transistor according to claim 9, further comprising a subcollector layer between the semiconductor substrate and the collector layer, wherein:
the heterojunction bipolar transistor is a first heterojunction bipolar transistor;
the subcollector layer is spaced from a subcollector layer of a second heterojunction bipolar transistor contiguous to the first heterojunction bipolar transistor; and
the second heterojunction bipolar transistor includes a base layer and an emitter layer stacked in this order on the collector layer on the first principal surface side of the semiconductor substrate.

11. The heterojunction bipolar transistor according to claim 10, wherein:
the semiconductor substrate further includes a through-hole portion extending therethrough between the first and second principal surfaces; and
the collector electrode reaches an inside of the through-hole portion of the semiconductor substrate to be in contact with the subcollector layer of the heterojunction bipolar transistor.

12. The heterojunction bipolar transistor according to claim 7, further comprising a collector electrode on a second principal surface side of the semiconductor substrate.

13. The heterojunction bipolar transistor according to claim 12, further comprising a subcollector layer between the semiconductor substrate and the collector layer, wherein:
the heterojunction bipolar transistor is a first heterojunction bipolar transistor;
the subcollector layer is spaced from a subcollector layer of a second heterojunction bipolar transistor contiguous to the first heterojunction bipolar transistor; and
the second heterojunction bipolar transistor includes a base layer and an emitter layer stacked in this order on the collector layer on the first principal surface side of the semiconductor substrate.

14. The heterojunction bipolar transistor according to claim 13, wherein:
the semiconductor substrate further includes a through-hole portion extending therethrough between the first and second principal surfaces; and
the collector electrode reaches an inside of the through-hole portion of the semiconductor substrate to be in contact with the subcollector layer of the heterojunction bipolar transistor.

15. A heterojunction bipolar transistor comprising:
a semiconductor substrate having first and second principal surfaces opposite each other; and
a collector layer, a base layer, and an emitter layer stacked in this order on a first principal surface side of the semiconductor substrate, wherein
the collector layer includes a first semiconductor layer with metalloid particles dispersed therein, a GaAs-based second semiconductor layer, and an AlGaAs-based third semiconductor layer; and
the second semiconductor layer is between the first semiconductor layer and the third semiconductor layer.

16. The heterojunction bipolar transistor according to claim 15, wherein:
the third semiconductor layer is a superlattice of AlGaAs layers and GaAs layers.

17. The heterojunction bipolar transistor according to claim 15, further comprising a collector electrode on a second principal surface side of the semiconductor substrate.

18. The heterojunction bipolar transistor according to claim 17, further comprising a subcollector layer between the semiconductor substrate and the collector layer, wherein:
the heterojunction bipolar transistor is a first heterojunction bipolar transistor;
the subcollector layer is spaced from a subcollector layer of a second heterojunction bipolar transistor contiguous to the first heterojunction bipolar transistor; and
the second heterojunction bipolar transistor includes a base layer and an emitter layer stacked in this order on the collector layer on the first principal surface side of the semiconductor substrate.

19. The heterojunction bipolar transistor according to claim 18, wherein:
the semiconductor substrate further includes a through-hole portion extending therethrough between the first and second principal surfaces; and
the collector electrode reaches an inside of the through-hole portion of the semiconductor substrate to be in contact with the subcollector layer of the heterojunction bipolar transistor.

* * * * *